United States Patent
Kawakubo et al.

(10) Patent No.: US 7,817,242 B2
(45) Date of Patent: Oct. 19, 2010

(54) EXPOSURE METHOD AND DEVICE MANUFACTURING METHOD, EXPOSURE APPARATUS, AND PROGRAM

(75) Inventors: Masaharu Kawakubo, Kumagaya (JP); Yuho Kanaya, Kumagaya (JP); Chiaki Nakagawa, Kumagaya (JP); Takahisa Kikuchi, Saitama (JP); Masahiko Akizuki, Fukaya (JP)

(73) Assignee: Nikon Corporation, Tokyo (JP)

( * ) Notice: Subject to any disclaimer, the term of this patent is extended or adjusted under 35 U.S.C. 154(b) by 542 days.

(21) Appl. No.: 10/581,060

(22) PCT Filed: Nov. 25, 2004

(86) PCT No.: PCT/JP2004/017447

§ 371 (c)(1),
(2), (4) Date: May 30, 2006

(87) PCT Pub. No.: WO2005/053007

PCT Pub. Date: Jun. 9, 2005

(65) Prior Publication Data

US 2007/0109524 A1  May 17, 2007

(30) Foreign Application Priority Data

Nov. 28, 2003  (JP)  ............................... 2003-400210

(51) Int. Cl.
G03B 27/42 (2006.01)
G03B 27/68 (2006.01)
G03B 27/58 (2006.01)
G03B 27/32 (2006.01)

(52) U.S. Cl. .............................. 355/53; 355/52; 355/72; 355/77

(58) Field of Classification Search .................. 355/77, 355/53, 40, 52, 72–75; 382/144, 145; 356/399–401; 700/31; 430/5, 8, 22, 30, 311; 250/559.29, 250/559.3; 702/150, 151
See application file for complete search history.

(56) References Cited

U.S. PATENT DOCUMENTS 4,833,621 A * 5/1989 Umatate ..................... 700/101
5,525,808 A * 6/1996 Irie et al. ..................... 250/548

(Continued)

FOREIGN PATENT DOCUMENTS

| JP | A-07-37785 | 2/1995 |
| JP | A-09-7921 | 1/1997 |
| JP | A-2001-196294 | 7/2001 |
| JP | A-2001-345243 | 12/2001 |
| JP | A-2002-353121 | 12/2002 |

*Primary Examiner*—Peter B Kim
*Assistant Examiner*—Christina Riddle
(74) *Attorney, Agent, or Firm*—Oliff & Berridge, PLC

(57) ABSTRACT

Positional information (an estimate value in which a linear component of positional deviation amount is corrected) of each shot on a wafer is calculated by a statistical computation using actual measurement values of positional information of a plurality of sample shots on the wafer (step 488). And, a variation amount of a non-linear component of positional deviation amount is calculated at predetermined intervals with respect to each of a plurality of measurement shots including the sample shots (step 496), and judgment is made about the necessity of update of correction information based on magnitude of the calculated variation amount of a non-linear component of each measurement shot area (step 498). Therefore, comparing with the case when actual values of positional information of all shots on the wafer are obtained at least once in each lot in order to update a correction value, the number of shots subject to positional information measurement and the measurement time can be reduced without fail.

19 Claims, 13 Drawing Sheets

U.S. PATENT DOCUMENTS

| | | | |
|---|---|---|---|
| 5,585,925 A * | 12/1996 | Sato et al. | 356/401 |
| 5,596,204 A * | 1/1997 | Irie et al. | 250/548 |
| 5,654,553 A * | 8/1997 | Kawakubo et al. | 250/548 |
| 5,805,866 A * | 9/1998 | Magome et al. | 716/19 |
| 5,808,910 A * | 9/1998 | Irie et al. | 700/279 |
| 6,002,487 A | 12/1999 | Shirata | |
| 6,198,527 B1 * | 3/2001 | Nishi | 355/53 |
| 6,239,858 B1 * | 5/2001 | Tomimatu | 355/18 |
| 6,338,925 B1 * | 1/2002 | Tomimatu | 430/30 |
| 6,710,848 B2 * | 3/2004 | Taniguchi | 355/53 |
| 6,992,767 B2 * | 1/2006 | Matsumoto et al. | 356/401 |
| 2001/0034563 A1 * | 10/2001 | Matsumoto et al. | 700/101 |
| 2002/0042664 A1 * | 4/2002 | Kikuchi | 700/114 |
| 2002/0111038 A1 * | 8/2002 | Matsumoto et al. | 438/763 |
| 2004/0126004 A1 * | 7/2004 | Kikuchi | 382/141 |
| 2006/0040191 A1 | 2/2006 | Okita | |

* cited by examiner

| PROCESS NAME n | Mn | MAP STORING REGION |
|---|---|---|
| A | 1 | |
| B | 1 | |
| C | 1 | |

EXPOSURE METHOD AND DEVICE MANUFACTURING METHOD, EXPOSURE APPARATUS, AND PROGRAM

TECHNICAL FIELD

The present invention relates to exposure methods and device manufacturing methods, exposure apparatuses, and programs, and more particularly to an exposure method in which an exposure processing of a specific process is continuously or intermittently performed to each of a plurality of photosensitive objects and a device manufacturing method that uses the exposure method, an exposure apparatus suitable to implement the exposure method, and a program suitable to make a computer for control of the exposure apparatus execute the exposure method.

BACKGROUND ART

In a manufacturing line of microdevices such as semiconductor devices, overlay exposure between a plurality of exposure apparatuses (apparatus numbers) is often performed. In such a case, since a grid error of a stage between exposure apparatuses (an error between stage coordinate systems that define a moving position of a wafer in the exposure apparatuses) exists, an overlay error is generated. In addition, even in the case of having no grid error of a stage between exposure apparatuses or in the case of using the same exposure apparatus, in the overlay between respective layers to which process processing steps such as etching, CVD (Chemical Vapor Deposition) or CMP (Chemical Mechanical Polishing) are performed, an overlay error may be generated at times because the process steps give distortion of an arrangement of shot areas.

In such a case, when an arrangement error variation of shot areas on a wafer that causes an overlay error (an arrangement error of shot areas) is a linear-component, the error can be removed by wafer alignment by the EGA method in which positional coordinates of only a plurality (three or more are required, and about 7 to 15 in general) of sample shot areas (also referred to as alignment shot areas) that are selected in advance on a wafer are measured, and from the measurement values, positional coordinates (an arrangement of shot areas) of all shot areas on the wafer is calculated using a statistical computation processing (the least-squares method and the like) (e.g. refer to Patent Document 1). However, when the arrangement error variation of shot areas is a non-linear component, it is difficult to remove it by the wafer alignment by the EGA method.

As a way to improve the above defects of the wafer alignment by the EGA method, recently a lithography system including an exposure apparatus has been proposed that can achieve exposure maintaining the overlay precision preferable even in the case when an arrangement error variation of shot areas in a wafer includes a non-linear component (e.g. refer to Patent Document 2).

However, in an exposure apparatus composing a lithography system disclosed in Patent Document 2, mainly aiming at correction of a grid error of a stage between exposure apparatuses, positional information of all shot areas of a wafer at the head of each lot has been measured in actual, then using the actual measurement values of positional information obtained by the measurement a linear component and a non-linear component of an arrangement deviation of shot areas on the wafer has been obtained, and the non-linear component has been stored as a correction value. With respect to the second and succeeding wafers in the same lot, using arrangement coordinates of all shot areas on the wafers obtained by performing the normal eight-point EGA and the non-linear component (the correction value) obtained for the wafer at the head of the lot, the wafers have been moved and overlay exposure has been performed to each shot area.

While an arrangement deviation of each shot area on the wafer hardly varies with respect to each lot, it is considered that how often and how the arrangement deviation varies depends on various factors such as an environment where the apparatus is placed, or an exposure process or its combination, and therefore, it is difficult to predict that.

Thus, as disclosed in Patent Document 2, when positional information of all shot areas on a wafer at the head of each lot is measured in actual, as a consequence it takes excessive time to measure the positional information of all shot areas, which decrease throughput more than it should be.

In addition, when taking into consideration one wafer, it is empirically known that how an arrangement deviation of shot areas varies depends on a place on the wafer. Therefore, it is hard to say that a method, in which positional information of all shot areas on a wafer at the head of the lot is measured in actual, is efficient.

Patent Document 1: the U.S. Pat. No. 4,780,617
Patent Document 2: the U.S. patent application Publication No. U.S. 2002/0042664

DISCLOSURE OF INVENTION

Problems which the Invention Attempts to Solve

The present invention was made under such circumstances, and has as its first object to provide an exposure method and an exposure apparatus, and a program that enable a processing with high throughput to be performed when exposure is continuously or intermittently performed to each of a plurality of photosensitive objects.

The second object of the present invention is to provide a device manufacturing method that enables the productivity of microdevices to improve.

Means for Solving the Problems

According to the first aspect of the present invention, there is provided a first exposure method in which an exposure processing of a specific process to each of a plurality of photosensitive objects, the method comprising: a first process in which an estimate values (values in which a linear component of positional deviation amount of each divided area is corrected) of positional information used to align each of a plurality of divided areas on a photosensitive object with a predetermined point are calculated by a statistical computation, using actual measurement values of positional information of a plurality of specific divided areas selected from the plurality of divided areas on the photosensitive object; and a second process in which with respect to a plurality of measurement divided areas on the photosensitive object including at least the plurality of specific divided areas, a non-linear component (a difference between the actual measurement value of positional information and the estimate value) of positional deviation amount from an individual fiducial position of each of the plurality of measurement divided areas (hereinafter simply referred to as 'positional deviation amount of each measurement divided area' as appropriate) is calculated respectively at predetermined intervals based on an actual measurement value of positional information of each of the plurality of measurement divided areas and on each of the estimate values, and judgment is made about the necessity of update of correction information based on magnitude of one of the non-linear component of positional deviation amount calculated of each of the plurality of measurement divided areas and a variation amount of the non-linear component, the correction information being used to correct a non-linear component of positional deviation amount from an individual fiducial position of each of the plurality of divided areas on the photosensitive object (hereinafter simply referred to as 'positional deviation amount of each of a plurality of divided areas' as appropriate). In this case, the variation amount of the non-linear component of positional deviation amount is obtained based on a non-linear component of positional deviation amount calculated previously and a non-linear component of positional deviation amount calculated this time.

In this manner, in the first exposure method of the present invention, at predetermined intervals, by checking magnitude of either of a non-linear component of positional deviation amount or a variation amount of the non-linear component, the judgment is made about the necessity of update of correction information. The non-linear component is obtained based on actual measurement values of positional information related to divided areas (measurement divided areas) that are a part of a plurality of divided areas on the photosensitive object and estimate values of positional information of the measurement divided areas calculated from all of or a part of the actual measurement values. Therefore, it becomes possible to reduce the number of divided areas subject to positional information measurement and the measurement time without fail, compared to the case when actual measurement values of positional information of all shot areas on a photosensitive object are obtained at least once in each lot, and correction values of positional deviation amounts of a plurality of divided areas are calculated using the actual measurement values, in order to update the correction values of positional deviation amounts of a plurality of divided areas.

Accordingly, when continuously or intermittently exposing each of a plurality of photosensitive objects, it becomes possible to improve throughput.

In this case, the exposure method may further comprise: a third process in which an update processing to update the correction information is performed when it is judged that update is necessary in the second process; and a fourth process in which exposure is performed controlling a position of the photosensitive object based on the estimate value of positional information of each of the plurality of divided areas and the correction information that is latest. In such a case, the correction information is updated when it is judged as a result of the above checking that update of the correction information is necessary, which does not result in decreasing the controllability of a position of the photosensitive object on exposure.

In this case, when the update processing of the correction information is performed, among the plurality of divided areas, at least a part of remaining divided areas excluding the plurality of measurement divided areas may be new measurement divided areas, and the correction information may be updated using a non-linear component of positional deviation amount from the individual fiducial position of each of the plurality of divided areas calculated based on actual measurement values of positional information of all measurement divided areas including the new measurement divided areas and the estimate values.

In this case, the new measurement divided areas may be determined based on evaluation results of the non-linear component of positional deviation amount of each of the plurality of divided areas included in the correction information before update. Or the new measurement divided areas may be determined based on evaluation results of one of the non-linear component of positional deviation amount of each of the plurality of measurement divided areas calculated in the second process and a variation amount of the non-linear component.

According to the second aspect of the present invention, there is provided a second exposure method in which an exposure processing of a specific process is performed to each of a plurality of photosensitive objects, the method comprising: a process in which estimate values (values in which a linear component of positional deviation amount of each divided area is corrected) of positional information used to align each of a plurality of divided areas on a photosensitive object with a predetermined point are calculated by a statistical computation, using actual measurement values of positional information of a plurality of specific divided areas selected from the plurality of divided areas on the photosensitive object; a process in which with respect to a plurality of measurement divided areas on the photosensitive object including at least the plurality of specific divided areas, a non-linear component of positional deviation amount from an individual fiducial position of each of the plurality of measurement divided areas obtained from each actual measurement value of positional information and each of the estimate values (a difference between the actual measurement value of positional information and the estimate value) is evaluated at predetermined intervals, and at least one of the number of new measurement divided areas to be added and an arrangement thereof is determined based on the evaluation results; a process in which correction information related to a non-linear component of positional deviation amount from an individual fiducial position of each of the plurality of divided areas on the photosensitive object is updated, using the non-linear component of positional deviation amount of each of the plurality of divided areas on the photosensitive object, the non-linear component of positional deviation amount being calculated based on actual measurement values of positional information of all measurement divided areas including the new measurement divided areas and on the estimate values; and a process in which exposure is performed controlling a position of the photosensitive object based on the estimate value of positional information of each of the plurality of divided areas and the correction information after update.

In this manner, in the second exposure method of the present invention, since at least one of the number of new measurement divided areas to be added and an arrangement thereof is determined based on the results of evaluation of a non-linear component of positional deviation amount of each measurement divided areas performed at predetermined intervals, a part of a plurality of divided areas (including at least a plurality of specific divided areas) on the photosensitive object can be set as initial measurement divided areas. In addition, in the case such as when the above evaluation results are favorable, the few number of new measurement divided areas to be added may sufficient at times. Therefore, the number of divided areas subject to positional information measurement and the measurement time can be reduced, compared to the case when actual measurement values of positional information of all divided areas on the photosensitive object are obtained at least once in each lot and correction values of positional deviation amounts of a plurality of divided areas are calculated using the actual measurement values.

In addition, since at least one of the number of new measurement divided areas to be added and an arrangement thereof is determined based on the results of evaluation of a non-linear component of positional deviation amount of each measurement divided area performed at predetermined intervals, an arrangement of the measurement divided areas can efficiently be set based on the evaluation results. And, since the correction information is updated, using the non-linear component of positional deviation amount of each of a plurality of divided areas on the photosensitive object that is calculated based on actual measurement values of positional information of all measurement divided areas including the new measurement divided areas efficiently arranged, the controllability of a position of the photosensitive object on exposure is not lowered as a consequence.

Thus, when continuously or intermittently exposing each of a plurality of photosensitive objects, exposure with high throughput and good overlay precision can be performed.

In this case, the evaluation of the non-linear component of positional deviation amount of each of the plurality of measurement divided areas may be performed, taking into consideration at least one of magnitude and a dispersion degree of the non-linear component of positional deviation amount of each of the plurality of measurement divided areas in the correction information before update. Or the evaluation of the non-linear component of positional deviation amount of each of the plurality of measurement divided areas may be performed, using a predetermined evaluation function. Besides, when the plurality of divided areas on the photosensitive object are grouped into a plurality of blocks in advance, the evaluation of the non-linear component of positional deviation amount of each of the plurality of measurement divided areas may be performed with respect to each block.

In each of the first and second exposure methods of the present invention, the intervals may be one of intervals of a predetermined number of the photosensitive objects and intervals of a predetermined period of time. In this case, the intervals of a predetermined number of the photosensitive objects include intervals of each lot and intervals of several lots.

In each of the first and second exposure methods of the present invention, as the plurality of measurement divided areas on the photosensitive object, only the plurality of specific divided areas or the plurality of specific divided areas and at least a part of remaining divided areas may be designated.

In each of the first and second exposure methods of the present invention, the correction information may be one of a correction map and a correction function.

According to the third aspect of the present invention, there is provided a device manufacturing method including a lithographic process, wherein in the lithographic process, an exposure processing of a specific process is continuously or intermittently performed to each of a plurality of photosensitive objects using either of the first exposure method or the second exposure method.

According to the fourth aspect of the present invention, there is provided a first exposure apparatus that performs an exposure processing of a specific process to each of a plurality of photosensitive objects, the apparatus comprising: a moving body that holds a photosensitive object; a detection system that detects actual measurement values of positional information of any divided areas among a plurality of divided areas on the photosensitive object held on the moving body; a computation unit that and calculates estimate values of positional information used to align each of the plurality of divided areas with a predetermined point by a statistical computation, using actual measurement values of positional information of a plurality of specific divided areas among the plurality of divided areas on the photosensitive object detected by the detection system; a judgment unit that with respect to a plurality of measurement divided areas on the photosensitive object including at least the plurality of specific divided areas, calculates a non-linear component of positional deviation amount from an individual fiducial position of each of the plurality of measurement divided areas respectively at predetermined intervals, based on an actual measurement value of positional information of each of the plurality of measurement divided areas detected by the detection system and each of the estimate values of positional information calculated by the computation unit, and judges the necessity of update of correction information based on magnitude of one of the non-linear component of positional deviation amount calculated of each of the plurality of measurement divided areas and a variation amount of the no-linear component, the correction information being used to correct a non-linear component of positional deviation amount from an individual fiducial position of each of the plurality of divided areas on the photosensitive object; an updating unit that performs a processing to update the correction information when the judgment unit judges that update is necessary; and a control unit that controls a position of the photosensitive object via the moving body based on the estimate value of positional information of each of the plurality of divided areas and the correction information that is latest, when exposing each of the plurality of divided areas.

With this apparatus, at predetermined intervals, the judgment unit judges the necessity of update of correction information by checking magnitude of either of a non-linear component of positional deviation amount, which is obtained based on the actual measurement values of positional information related to divided areas (measurement divided areas) that are a part of the plurality of divided areas on the photosensitive object and the estimate values of the measurement divided areas calculated from all of or a part of the actual measurement values, or a variation amount of the non-linear component. Therefore, it becomes possible to reduce the number of divided areas subject to positional information measurement and the measurement time without fail, compared to the case when actual measurement values of positional information of all divided areas on a photosensitive object are obtained at least once in each lot, and correction values of positional deviation amounts of a plurality of divided areas are calculated using the actual measurement values, in order to update the correction values of positional deviation amounts of a plurality of divided areas.

In addition, when it is judged by the judgment unit that update is necessary, the updating unit performs a processing of updating the correction information. That is, when it is judged that update of the correction information is necessary as a result of the above checking, the correction information is updated.

When exposing each of a plurality of divided areas, the control unit controls a position of the photosensitive object via the moving body based on the estimate value of positional information of each divided area and the correction information that is latest. As a consequence, a position control of the photosensitive object (the moving body) on exposure is performed with good precision.

Accordingly, when continuously or intermittently exposing each of a plurality of photosensitive objects, exposure with high throughput and good overlay precision can be performed.

In this case, the updating unit may comprise: a determining unit that determines at least a part of remaining divided areas excluding the plurality of measurement divided areas among the plurality of divided areas on the photosensitive object, as new measurement divided areas; and a calculating unit that calculates a non-linear component of positional deviation amount from the individual fiducial position of each of the plurality of divided areas on the photosensitive object as new correction information, based on actual measurement values of positional information of all measurement divided areas including actual measurement values of positional information of the new measurement divided areas detected by the detection system and on the estimate values.

In this case, the determining unit may determine the new measurement divide areas based on evaluation results of one of the non-linear component of positional deviation amount of each of the plurality of measurement divided areas calculated by the judgment unit and a variation amount of the non-linear component.

According to the fifth aspect of the present invention, there is provided a second exposure apparatus that performs an exposure processing of a specific process to each of a plurality of photosensitive objects, the apparatus comprising: a moving body that holds a photosensitive object; a detection system that detects actual measurement values of positional information of any divided areas on the photosensitive object held on the moving body; a computation unit that calculates estimate values of positional information used to align each of a plurality of divided areas with a predetermined point by a statistical computation, using actual measurement values of positional information of a plurality of specific divided areas among the plurality of divided areas on the photosensitive object detected by the detection system; an evaluation unit that with respect to a plurality of measurement divided areas on the photosensitive object including at least the plurality of specific divided areas, evaluates a non-linear component of positional deviation amount from an individual fiducial position of each of the plurality of measurement divided areas at predetermined intervals, based on an actual measurement value of positional information of each of the plurality of measurement divided areas detected by the detection system and each of the estimate values of positional information calculated by the computation unit, and determines at least one of the number of new measurement divided areas to be added and an arrangement thereof, based on the evaluation results; an updating unit that updates correction information related to a non-linear component of positional deviation amount from an individual fiducial position of each of the plurality of divided areas on the photosensitive object, using the non-linear component of positional deviation amount of each of the plurality of divided areas on the photosensitive object, the non-linear component of positional deviation amount being calculated based on actual measurement values of positional information of all measurement divided areas including actual measurement values of positional information of the new measurement divided areas detected by the detection system and on the estimate values; and a control unit that controls a position of the photosensitive object via the moving body based on the estimate value of positional information of each of the plurality of divided areas calculated by the computation unit and the correction information that is latest, when exposing each of the plurality of divided areas.

With this exposure apparatus, the evaluation unit can set a part of a plurality of divided areas (including at least a plurality of specific divided areas) on the photosensitive object as initial measurement divided areas. In addition, in the case such as when the above evaluation results are favorable, the evaluation unit sets the new measurement divided areas to be added small in number. Therefore, it becomes possible to reduce the number of divided areas subject to positional information measurement and the measurement time, compared to the case when actual measurement values of positional information of all shot areas on a photosensitive object are obtained at least once in each lot, and correction values of positional deviation amounts of a plurality of divided areas are calculated using the actual measurement values, in order to update the correction values of positional deviation amounts of a plurality of divided areas. Also, the evaluation unit can efficiently set an arrangement of the measurement divided areas in accordance with the evaluation results.

The updating unit uses a non-linear component of positional deviation amount of each of the plurality of divided areas on the photosensitive object that is calculated based on actual measurement values of positional information of all measurement divided areas including actual measurement values of positional information of the new measurement divided areas (the measurement divided areas arranged efficiently) detected by the detection system and the estimate values, and updates the correction information related to the non-linear component of positional deviation amount of each of the plurality of divided areas.

The control unit controls a position of the photosensitive object via the moving body based on the estimate value of positional information of each divided area calculated by the computation unit and the correction information that is latest, when exposing each of a plurality of divided areas.

Therefore, when continuously or intermittently exposing each of a plurality of photosensitive objects, it becomes possible to perform exposure with high throughput and good overlay precision.

In this case, when the plurality of divided areas on the photosensitive object are grouped into a plurality of blocks in advance, the evaluation unit performs the evaluation of the non-linear component of positional deviation amount of each of the plurality of measurement divided areas with respect to each block.

In each of the first and second exposure apparatuses of the present invention, the intervals are one of intervals of a predetermined number of the photosensitive objects and intervals of a predetermined period of time.

In each of the first and second exposure apparatuses of the present invention, a first mode in which only the plurality of specific divided areas are designated as the plurality of measurement divided areas on the photosensitive object, and a second mode in which the plurality of specific divided areas and at least a part of remaining divided areas are designated as the plurality of measurement divided areas on the photosensitive object are settable.

In each of the first and second exposure apparatuses of the present invention, the correction information is one of a correction map and a correction function.

According to the sixth aspect of the present invention, there is provided a first program that makes a computer for control of an exposure apparatus that performs an exposure processing of a specific process to each of a plurality of photosensitive objects execute a predetermined processing, the program making the computer execute: a procedure in which estimate values of positional information used to align each of a plurality of divided areas on a photosensitive object with a predetermined point are calculated by a statistical computation, using actual measurement values of positional information of a plurality of specific divided areas selected from the plurality of divided areas on the photosensitive object; and a procedure in which with respect to a plurality of measurement divided areas on the photosensitive object including at least the plurality of specific divided areas, a non-linear component of positional deviation amount from an individual fiducial position of each of the plurality of measurement divided areas is calculated respectively at predetermined intervals, based on an actual measurement value of positional information of each of the plurality of measurement divided areas and on each of the estimate values, and judgment is made about the necessity of update of correction information based on magnitude of one of the non-linear component of positional deviation amount calculated of each of the plurality of measurement divided areas and a variation amount of the non-linear component, the correction information being used to correct a non-linear component of positional deviation amount from an individual fiducial position of each of the plurality of divided areas on the photosensitive object.

According to the seventh aspect of the present invention, there is provided a second program that makes a computer for control of an exposure apparatus that performs an exposure processing of a specific process to each of a plurality of photosensitive objects execute a predetermined processing, the program making the computer execute: a procedure in which estimate values of positional information used to align each of a plurality of divided areas on a photosensitive object with a predetermined point are calculated by a statistical computation, using actual measurement values of positional information of a plurality of specific divided areas selected from the plurality of divided areas on the photosensitive object; and a procedure in which with respect to a plurality of measurement divided areas on the photosensitive object including at least the plurality of specific divided areas, a non-linear component of positional deviation amount from an individual fiducial position of each of the plurality of measurement divided areas obtained from each actual measurement value of positional information and each of the estimate values is evaluated at predetermined intervals, and at least one of the number of new measurement divided areas to be added and an arrangement thereof is determined based on the evaluation results; a procedure in which correction information related to a non-linear component of positional deviation amount from an individual fiducial position of each of the plurality of divided areas on the photosensitive object is updated, using the non-linear component of positional deviation amount of each of the plurality of divided areas on the photosensitive object, the non-linear component of positional deviation amount being calculated based on actual measurement values of positional information of all measurement divided areas including the new measurement divided areas and on the estimate values; and a procedure in which exposure is performed controlling a position of the photosensitive object based on the estimate value of positional information of each of the plurality of divided areas and the correction information after update.

BRIEF DESCRIPTION OF THE DRAWINGS

In the accompanying drawings.

BEST MODE FOR CARRYING OUT THE INVENTION

Figure 1:
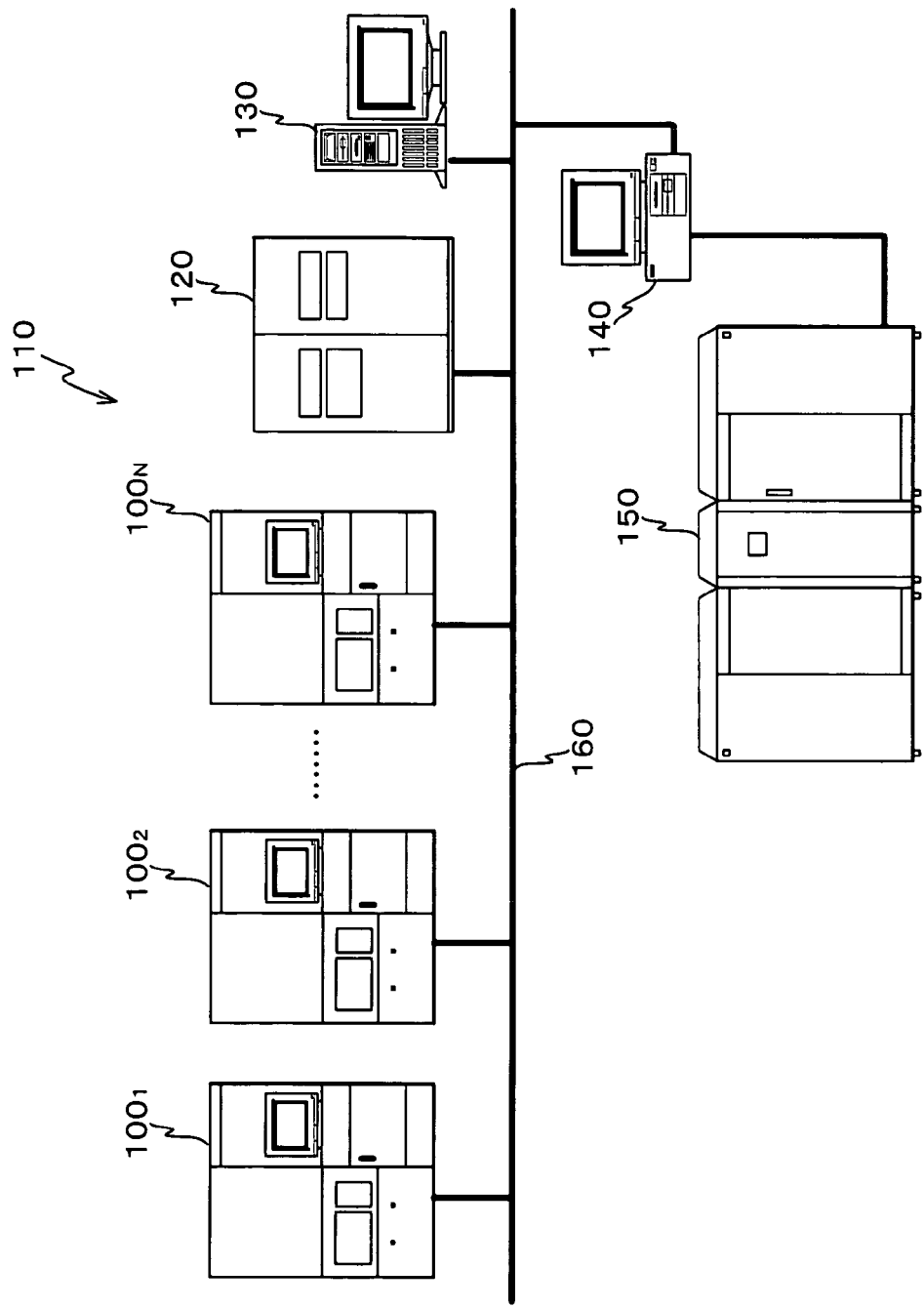
FIG. 1 is a view schematically showing an overall configuration of a lithography system in an embodiment of the present invention.

FIG. 1 schematically shows the entire configuration of a lithography system 110 in an embodiment of the present invention.

Lithography system 100 is equipped with N numbers of exposure apparatuses $100_1$, $100_2$, . . . , $100_N$, an overlay measuring instrument 120, a central information server 130, a terminal server 140, a host computer 150, and the like. Exposure apparatus $100_1$ to $100_N$, overlay measuring instrument 120, central information server 130 and terminal server 140 are connected to one another via local area network (LAN) 160. And, host computer 150 is connected to LAN160 via terminal server 140. That is, in terms of a hardware configuration, communication routes between exposure apparatus $100_i$ (i=1 to N), overlay measuring instrument 120, central information server 130, terminal server 140, and a host computer 150 are secured.

Each of exposure apparatuses $100_1$ to $100_N$ may be a projection exposure apparatus by the step-and-repeat-method (so-called a 'stepper'), or may be a projection exposure apparatus by the step-and-scan-method (hereinafter referred to as 'scanning exposure apparatus'). In the following description, all of exposure apparatuses $100_1$ to $100_N$ are to be scanning exposure apparatuses that have adjusting capability of distortion of a projected image. In particular, exposure apparatus $100_1$ is to be a scanning exposure apparatus that has correction function (hereinafter also referred to as 'grid correction function) of correcting a non-linear error between shot areas. The configuration of exposure apparatuses $100_1$ to $100_N$ and the like will be described later.

Overlay measuring instrument 120 is, for example, performs overlay error measurement to first several wafers in each lot or a pilot wafer (a test wafer) with respect to wafers in multiple lots (for example, twenty-five wafers in one lot) to be continuously processed.

In other words, exposure is performed to the pilot wafer and the like by a predetermined exposure apparatus according to a process, and the pilot wafer is put in an exposure apparatus that may be used for the next and succeeding layers, for example, to respective exposure apparatuses $100_i$ in a state where one or more layers of patterns have been already formed. Then, a pattern of a reticle (this pattern including at least a registration measurement mark (an overlay error measurement mark)) is transferred in actual by these exposure apparatuses, and after a processing such as development is performed, the pilot wafer is put in overlay measuring instrument 120. The overlay measuring instrument 120 then measures an overlay error (a relative positional error) between registration measurement mark images (for example, resist images) formed when exposing different layers of the wafer that has been put in, and further calculates overlay error information (overlay error information on an exposure apparatus that may be used for the next and succeeding layers) by performing a predetermined computation. That is, overlay measuring instrument 120 measures overlay error information of each pilot wafer in this manner.

A control system (not shown) of overlay measuring instrument 120 performs communication with central information server 130 via LAN 160, and receives predetermined data such as overlay error data which will be described later. In addition, overlay measuring instrument 120 performs communication with host computer 150 via LAN 160 and terminal server 140. Further, overlay measuring instrument 120 can also perform communication with exposure apparatus $100_1$ to $100_N$ via LAN 160.

Central information server 130 is configured of high-capacity storage unit and a processor. In the high-capacity storage unit, exposure history data regarding the lots of wafers is stored. The exposure history data includes overlay error information of each exposure apparatus $100_i$ in which the pilot wafer corresponding to a wafer in each lot (hereinafter referred to as 'overlay error information on wafer in lot') and the like have been measured in advance by overlay measuring instrument 120, and also includes an adjustment (a correction) parameter of image-forming characteristics of each exposure apparatus $100_i$ when exposing each layer, and the like.

In the embodiment, data of overlay error that occurs between specific layers of a wafer in each lot on exposure is calculated by the control system of overlay measuring instrument 120 (or other computer) based on overlay error information that is measured by overlay measuring instrument 120 with respect to the pilot wafer (the test wafer) or the first several wafers in each lot, then is stored in the high-capacity storage unit of central information server 130.

Terminal server 140 is configured as a gateway processor to absorb a difference between a communication protocol in LAN 160 and a communication protocol of host computer 150. The function of terminal server 140 makes communication between host computer 150 and each of exposure apparatuses $100_1$ to $100_N$ connected to LAN 160 possible.

Host computer 150 is composed of a large-sized computer, and in the present embodiment, host computer 150 executes overall control over wafer processing processes including at least a lithographic process.

Figure 2:
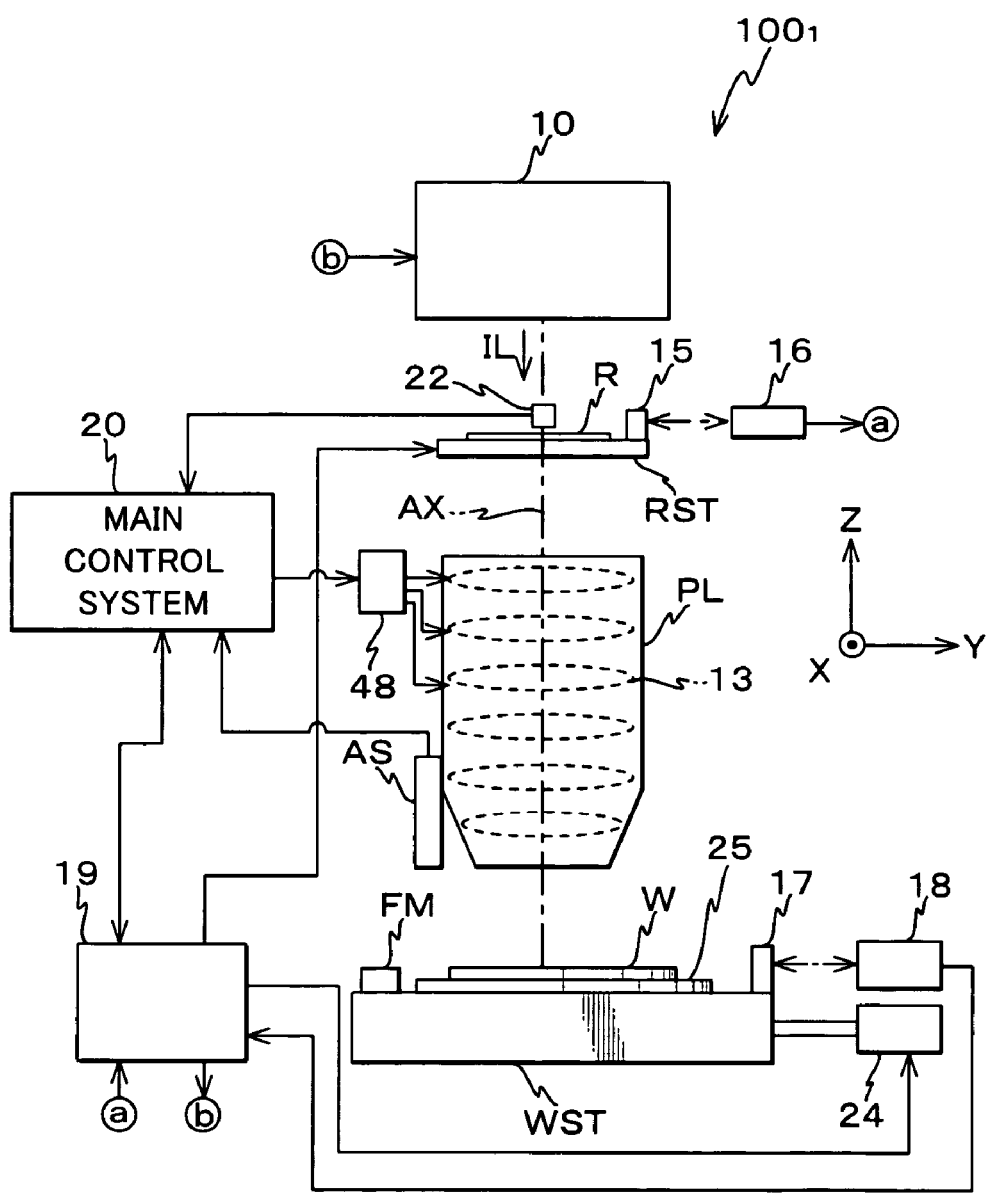
FIG. 2 is a view showing a schematic configuration of an exposure apparatus $100_1$ in FIG. 1.

FIG. 2 shows the schematic configuration of exposure apparatus $100_1$ that is a scanning exposure apparatus having grid correction function. The grid correction function is a function used to correct an error component that is a parallel translation component and also is a non-linear error component in the case when a positional error between a plurality of shot areas already formed on a wafer includes such an error component.

Exposure apparatus $100_1$ is equipped with an illumination system 10, a reticle stage RST holding a reticle R as a mask, projection optical system PL, a wafer stage WST as a moving body on which a wafer W as a photosensitive object is mounted, main control system 20 having overall control over the entire apparatus, and the like.

Illumination system 10 is, for example as disclosed in Kokai (Japanese Unexamined Patent Application Publication) No. 2001-313250 and the corresponding U.S. patent application Publication No. U.S. 2003/0025890 and the like, configured including a light source, an illuminance uniformity optical system including an optical integrator, a relay lens, a variable ND filter, a reticle blind (also referred to as a masking blade), a dichroic mirror and the like (non of which are shown). Illumination system 10 illuminates an illumination light IL with almost uniform illuminance to a slit-shaped illumination area defined by the reticle blind on reticle R on which a circuit pattern is drawn.

In this case, as illumination light IL, a far-ultraviolet light such as a KrF excimer laser (wavelength: 248 nm), a vacuum ultraviolet light such as an ArF excimer laser (wavelength: 193 nm) or a $F_2$ laser (wavelength: 157 nm), or the like is used. An emission line (a g-line, an i-line, or the like) of ultraviolet region from an extra-high pressure mercury lamp can also be used as illumination light IL. As the optical integrator, a fly-eye lens, a rod integrator (an internal reflection type integrator), diffractive optical element, or the like is used. As illumination system 10, the configuration as disclosed in Kokai (Japanese Unexamined Patent Application Publication) No. 06-349701 and the corresponding U.S. Pat. No. 5,534,970, and the like may be employed. As long as the national laws in designated states (or elected states), to which this international application is applied, permit, the above disclosures of the publication and the U.S. patent are incorporated herein by reference.

On reticle stage RST, reticle R is fixed by, for example, vacuum chucking. Reticle stage RST has a structure finely drivable within an XY plane perpendicular to an optical axis of illumination system 10 (coincident with an optical axis AX of projection optical system PL to be described later) by a reticle stage drive section (not shown) including a linear motor or the like and is also drivable at a designated scanning velocity in a predetermined scanning direction (to be a Y-axis direction that is a horizontal direction on the page surface of FIG. 1, in this case).

The position of reticle stage RST within a stage-moving plane is measured at a resolution of, for example, approximately 0.5 to 1 nm with a reticle laser interferometer (hereinafter referred to as 'reticle interferometer') 16 at all times via a movable mirror 15. Position information of reticle stage RST from reticle interferometer 16 is supplied to a stage control system 19 and to main control system 20 via stage control system 19. Stage control system 19 moves reticle stage RST via reticle stage drive section (drawing omitted) based on the position information of reticle stage RST, according to instructions from main control system 20.

Above reticle R, a pair of reticle alignment systems 22 (the reticle alignment system in depth of the page surface is not shown in FIG. 1) is arranged. Although it is omitted in the drawings, each reticle alignment system 22 is constituted including an episcopic illumination system used to illuminate a mark subject to detection with illumination light that has the same wavelength with illumination light IL and an alignment microscope used to pick up an image of the mark subject to detection. The alignment microscope includes an image-forming optical system and an imaging device, and the imaging results by the alignment microscope are supplied to main control system 20. In this case, deflection mirrors (not shown) used to guide detection beams from reticle R to reticle alignment detection systems 22 are arranged freely movable, and when the exposure sequence begins, the deflection mirrors are severally withdrawn outside the optical path of illumination light IL, integrally with reticle alignment systems 22 by a drive unit (not shown) according to instructions from main control system 20.

Projection optical system PL is disposed below reticle stage RST in FIG. 1, and the direction of optical axis AX of projection optical system PL is a Z-axis direction. As projection optical system PL is, for example, a both-side telecentric reduction system is used. The projection magnification of projection optical system PL is for example, ¼, ⅕, or ⅙. Therefore, when reticle R is illuminated with illumination light IL from illumination system 10, illumination light IL passing through reticle R forms a reduced image (partially inverted image) of a circuit pattern on reticle R within an irradiation area (the illumination area described above) of illumination light IL on wafer W which surface is coated with a resist (photosensitive agent), via projection optical system PL.

As projection optical system PL, a dioptric system is used that is made up of a plurality of, for example, ten to twenty slices of dioptric optical element (lens element) 13 only, as representatively shown in FIG. 2 using six slices of lens element 13. Out of a plurality of lens element 13 constituting projection optical system PL, a plurality of lens element on a side of an object surface (on a side of reticle R) are movable lenses that can be shifted along a Z-axis direction (an optical axis direction of projection optical system PL), and are drivable in a tilt direction with respect to the XY plane (i.e. a rotational direction around an X axis (θx direction) and a rotational direction around a Y axis (θy direction)), by drive elements (not shown) for example, piezo elements and the like. When an image-forming characteristic correction controller 48 independently adjusts an applied voltage to each drive element based on instructions from main control system 20, each movable lens is individually driven and various image-forming characteristics (magnification, distortion, astigmatism, comma, curvature of field, and the like) of projection optical system PL are adjusted. Image-forming characteristic correction controller 48 can control a light source to shift a center wavelength of illumination light IL, and the image-forming characteristics can be adjusted by the shift of the center wavelength the same as by the movement of the movable lenses.

Wafer stage WST is arranged on a base (not shown) below projection optical system PL in FIG. 2. Wafer stage WST has a configuration so as to be driven in the Y-axis direction and the X-axis direction (a direction orthogonal to the page surface of FIG. 2) orthogonal to the Y-axis direction with a predetermined stroke, for example, by a wafer stage drive section 24 including a linear motor and the like, and to be finely drivable in the Z-axis direction, the θx direction, the θy direction, and the θz direction (a rotational direction around a Z axis). On wafer stage WST, wafer holder 25 is mounted, and on wafer holder 25 wafer W is fixed, for example, by vacuum chucking or the like.

The position of wafer stage WST within the XY plane is detected with a resolution of, for example, approximately 0.5-1 nm at all times by a wafer laser interferometer system 18 via movable mirror 17 that is arranged on the upper surface of wafer stage WST. In actual, on wafer stage WST, a Y movable mirror having a reflection surface orthogonal to a scanning direction (the Y-axis direction) and an X movable mirror having a reflection surface orthogonal to a non-scanning direction (the X-axis direction) are arranged, and as wafer laser interferometers corresponding to theses movable mirrors, a Y interferometer that irradiates an interferometer beam perpendicular to the Y movable mirror, and an X interferometer that irradiates an interferometer beam perpendicular to the X movable mirror are arranged. However, movable mirror 17 and wafer laser interferometer 18 are representatively shown in FIG. 2. In other words, in the embodiment, a stationary coordinate system (an orthogonal coordinate system) that defines a moving position of wafer stages WST is defined by the measurement axis of the Y interferometer and X interferometer of wafer laser interferometer system 18. In the following description, the stationary coordinate system is also referred to as 'stage coordinate system'. The reflecting surface (corresponding to the reflecting surface of the Y movable mirror and X movable mirror) of interferometer beam described previously may be formed by polishing an edge surface of wafer stage WST.

Positional information (or velocity information) of wafer stage WST on the stage coordinate system is supplied to stage control system 19 and main control system 20 via stage control system 19. Stage control system 19 controls wafer stage WST via wafer stage drive section 24 based on the positional information (or velocity information) of wafers stage WST in accordance with instructions from main control system 20.

In the vicinity of wafer W on wafer stage WST, a fiducial mark plate FM is fixed. A surface of fiducial mark plate FM is set to the same height as a surface of wafer W, and on the surface of fiducial mark plate FM, a fiducial mark for baseline measurement of an alignment system, a fiducial mark for reticle alignment, and other fiducial marks are formed.

On a side surface of projection optical system PL, an alignment system AS by an off-axis method. As alignment system AS, an alignment sensor (of Field Image Alignment (FIA) system) as disclosed in, for example, Kokai (Japanese Unexamined Patent Application Publication) No. 02-054103 and the corresponding U.S. Pat. No. 4,962,318, and the like. Alignment system AS irradiates the wafer with an illumination light having a predetermined wavelength width (e.g. a white light), and forms an image of an alignment mark on the wafer and an image of an index mark on an index plate arranged within a plane conjugate with the wafer using an objective lens and the like, on a light-receiving surface of a imaging device (CCD camera an the like), and detects the alignment mark. Alignment system AS outputs the imaging results of the alignment mark (and the fiducial mark on fiducial mark plate FM) towards main control system 20. As long as the national laws in designated states (or elected states), to which this international application is applied, permit, the above disclosures of the publication and the U.S. patent are incorporated herein by reference.

Further, in exposure apparatus $100_1$, a multiple focal point position detection system by the oblique incident method is fixed to a supporting section (drawing omitted) supporting projection optical system. The multiple focal point position detection system is composed of an irradiation optical system (not shown) that supplies an image-forming beam from an oblique direction with respect to the direction of optical axis AX to form a plurality of slit images on the best image-forming plane of projection optical system, and a light-receiving optical system (not shown) that receives each reflected beam of the image-forming beam reflected off a surface of wafer W via each slit. As the multiple focal point position detection system, the configuration similar to the one disclosed in, for example, Kokai (Japanese Unexamined Patent Application Publication) No. 06-283403, and the corresponding U.S. Pat. No. 5,448,332, and the like is used.

Stage control system 19 performs focus leveling control of wafer W by finely driving wafer stage WST the Z-axis direction and the tile direction (the θx direction and θy direction) via wafer stage drive section 24 based on wafer positional information from the multiple focal point position detection system. As long as the national laws in designated states (or elected states), to which this international application is applied, permit, the above disclosures of the publication and the U.S. patent are incorporated herein by reference.

Figures 3, 4:
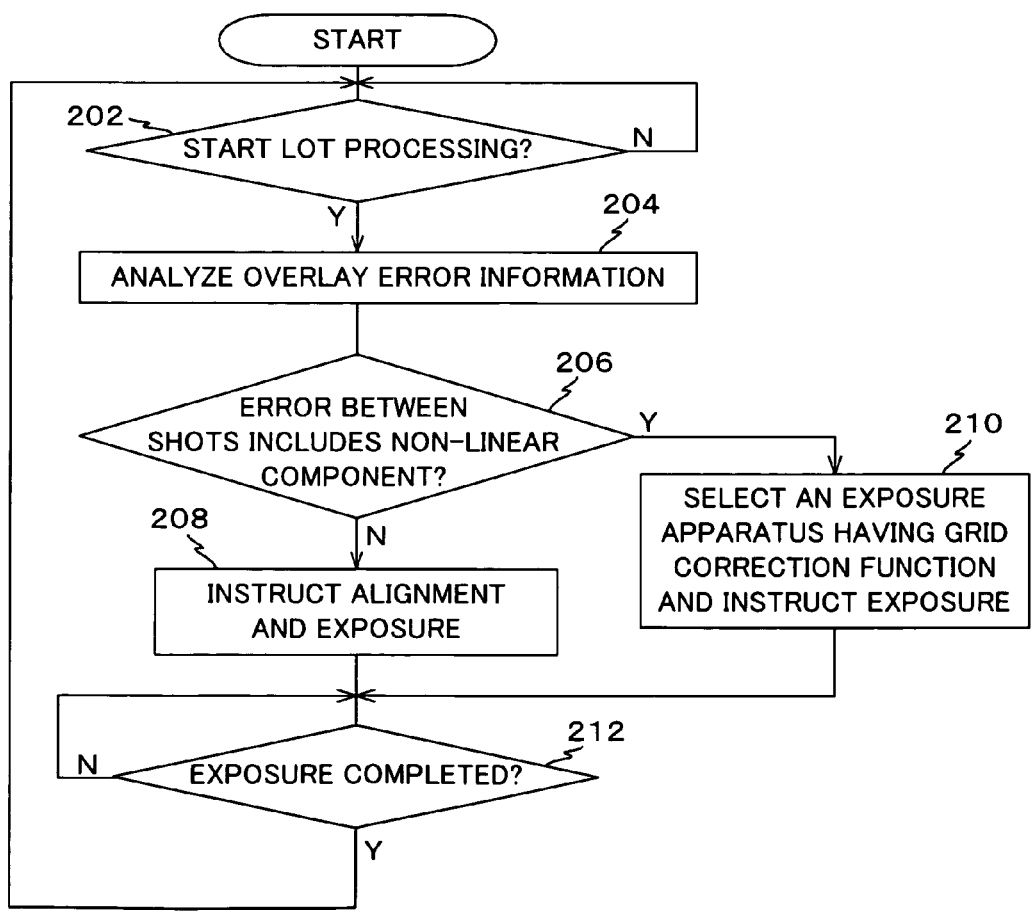
FIG. 3 is a view showing a data table stored in a memory such as RAM constituting a main control system 20.
FIG. 4 is a view schematically showing a processing algorithm related to an exposure processing of a wafer by a host computer.

Main control system 20 is configured including a microcomputer or a workstation, and performs overall control over each component of the apparatus. Main control system 20 is connected to LAN160 previously described. In the embodiment, in a storage unit such as a hard disk that main control system 20 comprises, a correction map is stored as database. The correction map is composed of correction information used to correct a non-linear component of positional deviation amount from an individual fiducial position (e.g. a design position) of each shot area, which is related to all combinations of shot map data that exposure apparatus $100_1$ may use and the selection of sample shot areas. The correction map is used in a second grid correction function to be described later on. In addition, in a memory such as RAM constituting main control system 20, a data table as shown in FIG. 3 is stored. The first row of the data table is a region where each title is stored and data is not updated. The second and succeeding row are regions where data is stored and data is updated. The first column of the data table, that is, a region of a process name n is a region where process names A, B, C, . . . corresponding to process programs, which are setting programs of exposure conditions given by host computer 150, are stored. In the embodiment, it is premised that process names A, B, C, . . . that may be designated in a series of exposure processing are stored in advance in the region of process name n. The second column of the data table is a region where a parameter $M_n$ value, which indicates what number a target lot is among lots to which a processing of process name n (A, B, C, . . . ) is performed, is stored, and 'one' is set in all rows in the second column in an initial state. In addition, the third column of the data table is a region where a correction map to be used in a first grid correction function, which will be described later, is stored, and nothing is stored in an initial state.

The above database (made up of multiple types of correction maps to be used in the second grid correction function) is made in the procedures of making a fiducial wafer, and measuring a mark on the fiducial wafer and making database based on the mark measurement results. The concrete method is disclosed in detail in, for example, the U.S. patent application Publication No. U.S. 2002/0042664 mentioned earlier. As long as the national laws in designated states (or elected states), to which this international application is applied, permit, the above disclosures of the publication and the U.S. patent are incorporated herein by reference.

The other exposure apparatuses $100_2$ to $100_N$ have the similar configurations except that a part of algorithm of the main control system is different, and that the above database is not stored in a storage unit such as a hard disk and that a data table is not prepared in a memory such as RAM.

Next, an exposure processing of a wafer by a lithography system 110 in the present embodiment will be described referring to FIGS. 4 to 13.

FIG. 4 schematically shows a processing algorithm related to an exposure processing of a wafer by host computer 150 constituting lithography system 110.

As a premise of execution of the algorithm related to the exposure processing shown in FIG. 4, exposure has been already performed to one or more layers of wafer W subject to exposure, and exposure history data of wafer W and the like have been stored in central information server 130. Also, overlay error information of a pilot wafer going through the same process as of wafer W of the lot subject to exposure has been measured by overlay measuring instrument 120 and has also been stored in central information server 130.

First, in step 202, host computer 150 waits until it comes to a situation where a processing of a wafer in a lot is to start. And, when it comes to a situation where a processing of a wafer in a lot is to start, the procedure proceeds to step 204 and host computer 150 reads out overlay error information of a wafer of the lot subject to exposure from central information server 130 via terminal server 140 and LAN160, and analyzes the overlay error information.

In step 206, as a consequence of the above analysis, host computer 150 judges whether or not an error between shots on wafer W in the lot includes a non-linear component exceeding a predetermined value on wafer W in the lot.

In this case, the error between shots means the case such as when a positional error between a plurality of shot areas already formed on wafer W includes a parallel translation component. Therefore, only when the positional error between shot areas on wafer W hardly includes any of distortion components caused by wafer thermal expansion, a difference of a stage grid between apparatus numbers (exposure apparatuses), and the process, the error between shots can be ignored. Normally, the positional error between shot areas on wafer W includes either of the above distortion components, however, the error between shots cannot be ignored.

When the judgment in step 206 is negative, that is, when there is an error between shots but the error includes only a liner component (a wafer magnification error, a wafer orthogonal degree error, a wafer rotational error, or the like), the procedure proceeds to step 208. In step 208, host computer 150 instructs a main control system of exposure apparatus $100j$ that has been selected out of exposure apparatuses $100_1$ to $100_N$ (in this case, exposure apparatus $100j$ has been determined in advance in order to simplify the description) to perform wafer alignment by the EGA method and exposure. At this time, host computer 150 designates the name of a process program corresponding to setting instruction information of exposure conditions (a setting file of exposure conditions) as well as instructing the main control system of exposure apparatus $100_j$ to perform exposure.

Meanwhile, when the judgment in step 206 is affirmative, the procedure proceeds to step 210, and host computer 150 selects an exposure apparatus having a grid correction function (exposure apparatus $100j$ in the embodiment) and instructs the exposure apparatus to perform exposure. At this time, host computer 150 also instructs the setting of exposure conditions.

In either case, then the procedure proceeds to step 212 and waits until the exposure processing of the wafer in the lot is completed.

When it is notified that the exposure is completed, from the exposure apparatus which has been instructed to perform exposure in the above step 208 or 210, the judgment is made that the processing related to the lot is completed, and the procedure returns to step 202, in which host computer 150 waits until it comes to a situation where a processing of a wafer in a lot is to start.

When it comes to a situation where a processing of a wafer in a lot is to start, the processing in the above step 204 and the succeeding steps are repeated.

That is, host computer 150 repeats the processing related to wafers in a plurality of lots in this manner.

Figure 5:
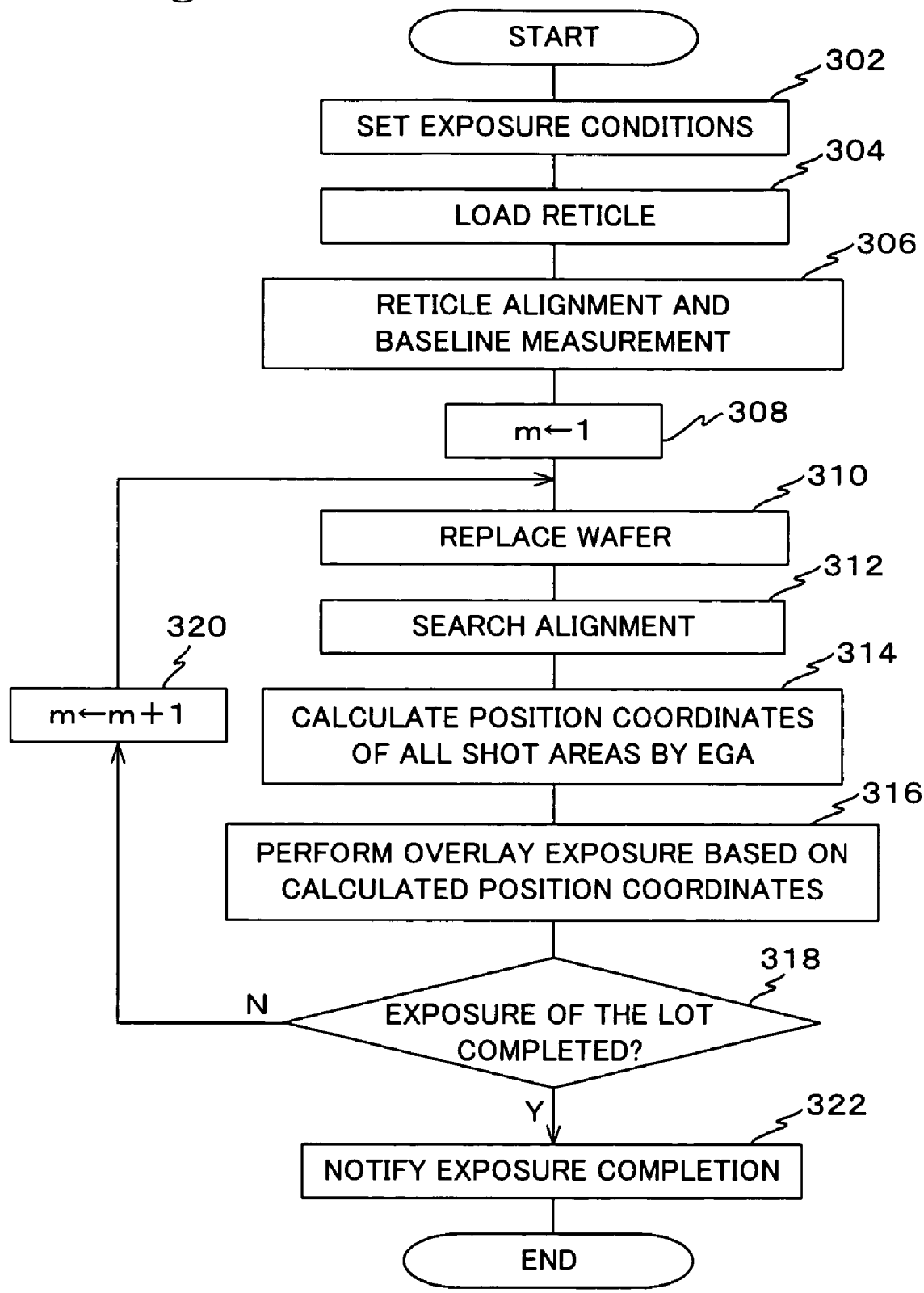
FIG. 5 is a flowchart schematically showing a processing algorithm of a main control system of an exposure apparatus that receives exposure instructions from the host computer in step 208 in FIG. 4.

When the judgment is negative in the above step 206, the main control system of exposure apparatus 100j that receives exposure instruction from host computer 150 in the above step 208 performs a processing according to a processing algorithm shown in the flowchart in FIG. 5.

First, in step 302, the main control system selects the process program file that has been designated by host computer 150 in the above step 208, and sets exposure conditions according to the process program file.

In step 304, reticle R is loaded on reticle stage RST using a reticle loader (not shown).

In step 306, reticle alignment and baseline measurement of alignment system AS are performed using fiducial mark plate FM. The measuring method of baseline is disclosed in, for example, Kokai (Japanese Unexamined Patent Application Publication) No. 07-176468, and the corresponding U.S. Pat. No. 5,646,413, and the like. As long as the national laws in designated states (or elected states), to which this international application is applied, permit, the above disclosures of the publication and the U.S. patent are incorporated herein by reference.

When the reticle alignment and the baseline measurement of alignment system AS are completed, the procedure proceeds to step 308.

In step 308, a count value m of a counter (not shown), which shows what number wafer W subject to exposure is within a lot (e.g. twenty-five wafers in one lot), is initialized to one (m←1). Then the procedure proceeds to step 310.

In step 310, the wafer after the exposure processing (referred to as 'W'' for the sake of convenience) on wafer holder 25 in FIG. 2 is replaced with wafer W before exposure, using a wafer loader (not shown). However, when wafer W' does not exist on wafer holder 25, wafer W before exposure is simply loaded on wafer holder 25.

In step 312, search alignment is performed to wafer W loaded on wafer holder 25. Specifically, for example, at least two search alignment marks placed on the periphery section almost symmetrically with respect to the center of wafer W (hereinafter shortened appropriately as 'search mark') are detected using alignment system AS. The detection of these two search marks is performed by sequentially positioning wafer stage WST so that each of search marks is placed within a detection field of alignment system AS and also setting a magnification of alignment system AS to a low magnification. Then, position coordinates of two search marks on a stage coordinate system are obtained based on the detection results of alignment system AS (a relative positional relation between an index center of alignment system AS and each search mark) and a measurement value of wafer interferometer system 18 when detecting each search mark. Afterwards, a residual rotational error of wafer W is calculated from the position coordinates of two marks, and wafer holder 25 is finely rotated so that the residual rotational error becomes almost zero. With this operation, the search alignment of wafer W is completed.

In step 314, using the normal EGA (e.g. the eight-point EGA), position coordinates (estimate values of positional information) of all shot areas on wafer W are calculated. More specifically, using alignment system AS in the same manner as previously described (however, a magnification of alignment system AS is set to a high magnification), wafer marks arranged in eight shot areas (sample shot areas) selected in advance on wafer W are measured, and position coordinate s of these sample shots areas on the stage coordinate system are obtained. Then, based on the obtained position coordinates of sample shot areas and the corresponding position coordinates in design, statistical computation (the EGA computation of equation (2) to be described later) is performed using the least-squares method as disclosed in, for example, the U.S. Pat. No. 4,780,617 mentioned earlier, and six parameters 'a' to 'f' in equation (1) to be described later (corresponding to six parameters: a rotation θ related to an arrangement of each shot area on a wafer, scalings Sx and Sy in the X-axis and Y axis directions, an orthogonal degree Ort, and offsets Ox and Oy in the X-axis and Y axis directions) are calculated. Based on the calculation results and the position coordinates in design of shot areas, position coordinates (arrangement coordinates) of all shot areas are also calculated. After the calculation results are stored in a predetermined region in the internal memory, the procedure proceeds to step 316.

Although the description is out of sequences, a statistical processing performed in the EGA method will be briefly described below. Arrangement coordinates in design of 'h' number ('h' is an integer of h≧3, for example, h=8) of specific shot areas (sample shot areas) on a wafer are to be $(X_n, Y_n)$ (n=1, 2, . . . , h). A linear model as expressed in the following equation (1) is assumed with regard to a deviation $(\Delta X_n, \Delta Y_n)$ from the arrangement coordinate in design.

$$\begin{pmatrix} \Delta X_n \\ \Delta Y_n \end{pmatrix} = \begin{pmatrix} a & b \\ c & d \end{pmatrix} \begin{pmatrix} X_n \\ Y_n \end{pmatrix} + \begin{pmatrix} e \\ f \end{pmatrix} \qquad (1)$$

Further, when a deviation (a measurement value) of the actual arrangement coordinate of each of 'h' number of sample shot areas from the arrangement coordinate in design is to be $(\Delta x_n, \Delta y_n)$, the square sum E of a residual difference between this deviation and the deviation from the arrangement coordinate in design assumed in the above linear model is expressed in the following equation (2).

$$E = \Sigma\{(\Delta x_n - \Delta X_n)^2 + (\Delta y_n - \Delta Y_n)^2\} \qquad (2)$$

Then, parameters a, b, c, d, e, and f may be obtained so as to minimize the above equation. In the EGA method, based on parameter 'a' to 'f' calculated as described above and the arrangement coordinate in design, the arrangement coordinates (estimate values) of all shot areas on the wafer are calculated.

In step 316, based on the arrangement coordinates of all shot areas stored in a predetermined region within the internal memory described earlier and the baseline amount measured in advance, the exposure operation by the step-and-scan method is performed by repeating an operation for sequentially moving wafer W to an acceleration starting position (a scanning starting position) to expose each shot area on wafer W and an operation for transferring a reticle pattern onto the wafer while synchronously moving reticle stage RST and wafer stage WST in a scanning direction. With this operation, the exposure processing to wafer W at the head of a lot (the first wafer in the lot) is completed. Thus, exposure with high precision is performed in which the overlay error caused by a positional error (linear component) between shot areas that have already been formed on wafer W is corrected.

In step 318, the judgment is made of whether or not exposure of all wafers within the lot is completed by judging whether or not count value m of the counter described earlier is greater than 24 (m>24). In this case, because m equals one (m=1), the negative judgment is made and the procedure proceeds to step 320. After count value m of the counter is incremented by one (m←m+1), the procedure returns to step 310.

In step 310, the wafer at the head of the lot, after the exposure processing on wafer holder 25 in FIG. 2 is replaced with the second wafer W in the lot, using a wafer loader (not shown). After that, the processing in steps 312 to 316 described previously is repeated to the second wafer W.

In the manner as described above, when exposure to the second wafer W in the lot is completed, the procedure proceeds to step 318, in which the judgment is made of whether or not exposure of all wafers in the lot is completed. In this case, however, the judgment is negative, and after count value m of the counter is incremented (m←m+1) in step 320, a loop processing of steps 310 to 320 and the judgment are repeatedly performed until exposure of all wafers in the lot is completed.

When exposure of all wafers in the lot is completed and the affirmative judgment is made in step 318, the procedure proceeds to step 322. After host computer 150 is notified via LAN160 and terminal server 140 that exposure is completed, a series of processing is completed.

Figure 6:
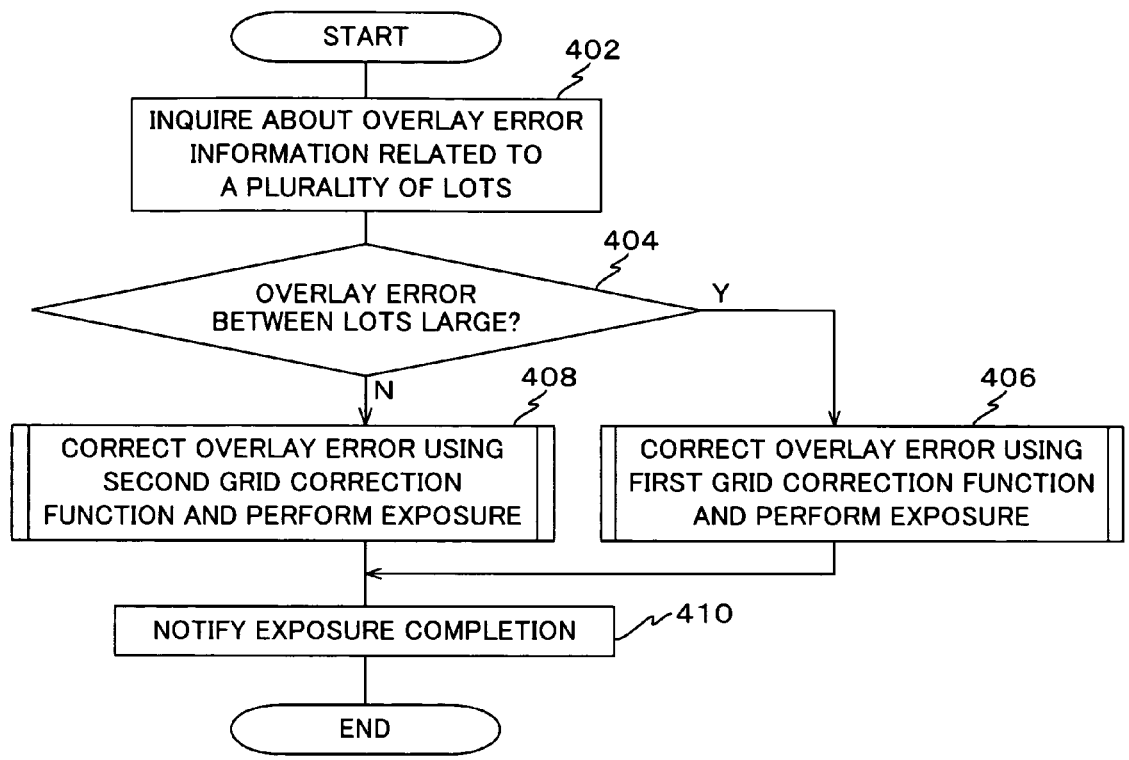
FIG. 6 is a flowchart schematically showing a processing algorithm of main control system 20 of exposure apparatus $100_1$ that receives exposure instructions from the host computer in step 210 in FIG. 4.

Meanwhile, when the judgment is affirmative in step 206 in FIG. 4 described earlier, main control system 20 of exposure apparatus $100_1$ that receives the exposure instructions from host computer 150 in the above step 210 performs a processing according to a processing algorithm shown in the flowchart in FIG. 6.

In other words, first of all, in step 402, main control system 20 inquires central information server 130 via LAN160 about overlay error information of a wafer in a lot related to the exposure apparatus $100_1$, regarding a plurality of lots including a lot subject to exposure in the center. Then in step 404, based on the overlay error information regarding a plurality of lots that has been obtained from central information server as a response to the above inquiry, the judgment is made of whether or not the overlay error between lots in series is larger compared with a predetermined threshold. When the judgment is affirmative, the procedure proceeds to a subroutine 406 in which the overlay error is corrected using the first grid correction function and exposure is performed.

Figure 7:
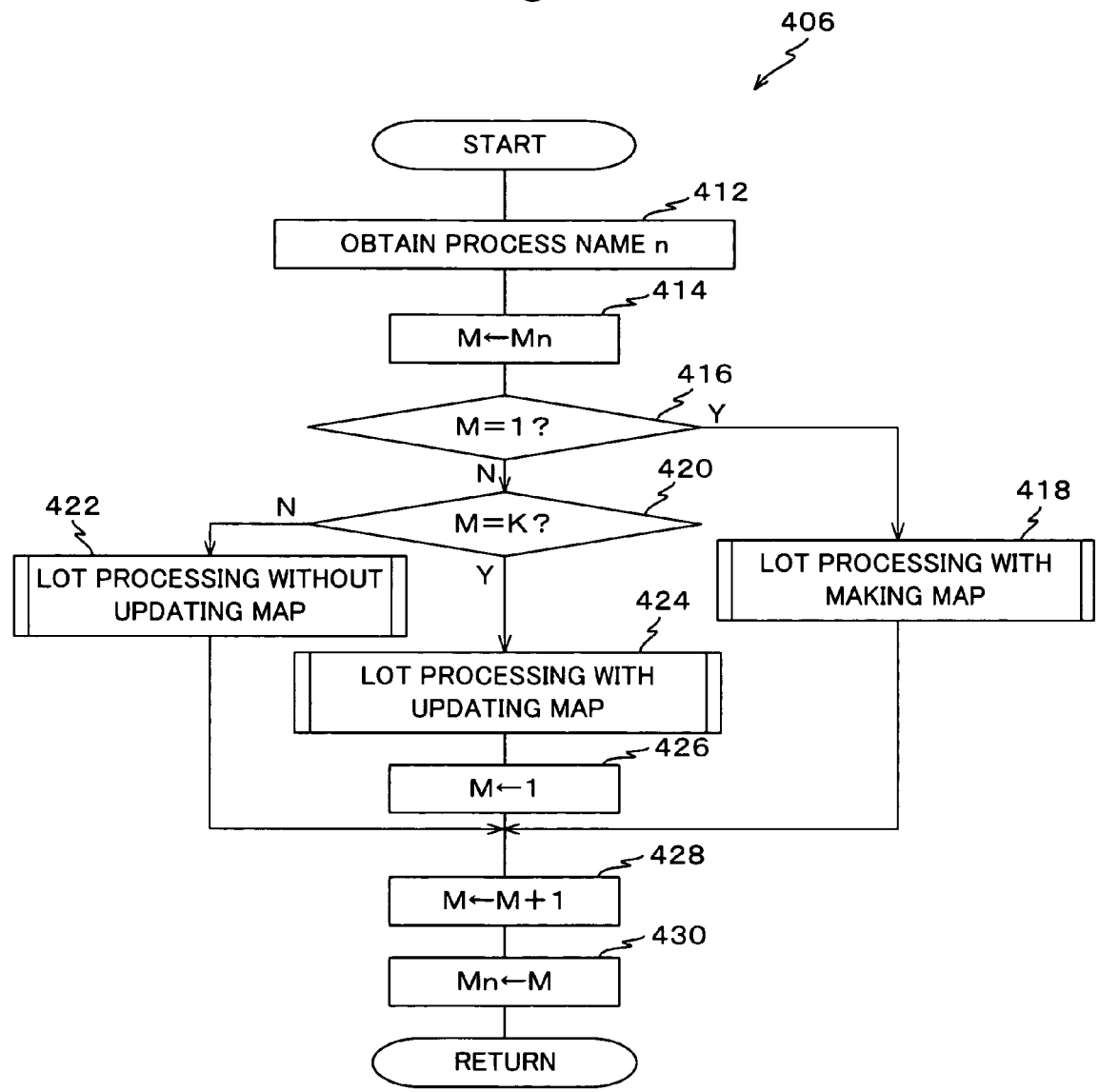
FIG. 7 is a flowchart showing a concrete processing algorithm of subroutine 406 in FIG. 6.

In subroutine 406, first in step 412 shown in FIG. 7, process name n is obtained from the process program file corresponding to setting instruction information of exposure conditions that has been given along with the exposure instructions from host computer 150 in step 210 described earlier.

Process name n is either of process names A, B, C, . . . that are stored in the data table in FIG. 3 previously described and may be designated in a series of exposure processing. In this case, process name A is obtained as process name n.

In step 414, a value ('one' in this case) of parameter $M_n$ within the data table that corresponds to process name n (process name A in this case) obtained in step 412 is set to a count value M of a counter that indicates the order of lots (M←$M_n$(=1)).

In step 416, the judgment is made of whether count value M is one or not, that is, whether or not a lot subject to exposure is the first lot to which a processing of obtained process name n (process name A in this case). In this case, the judgment is affirmative because M equals one (M=1), and the procedure proceeds to a subroutine of lot processing with making a map in step 418.

Figure 8:
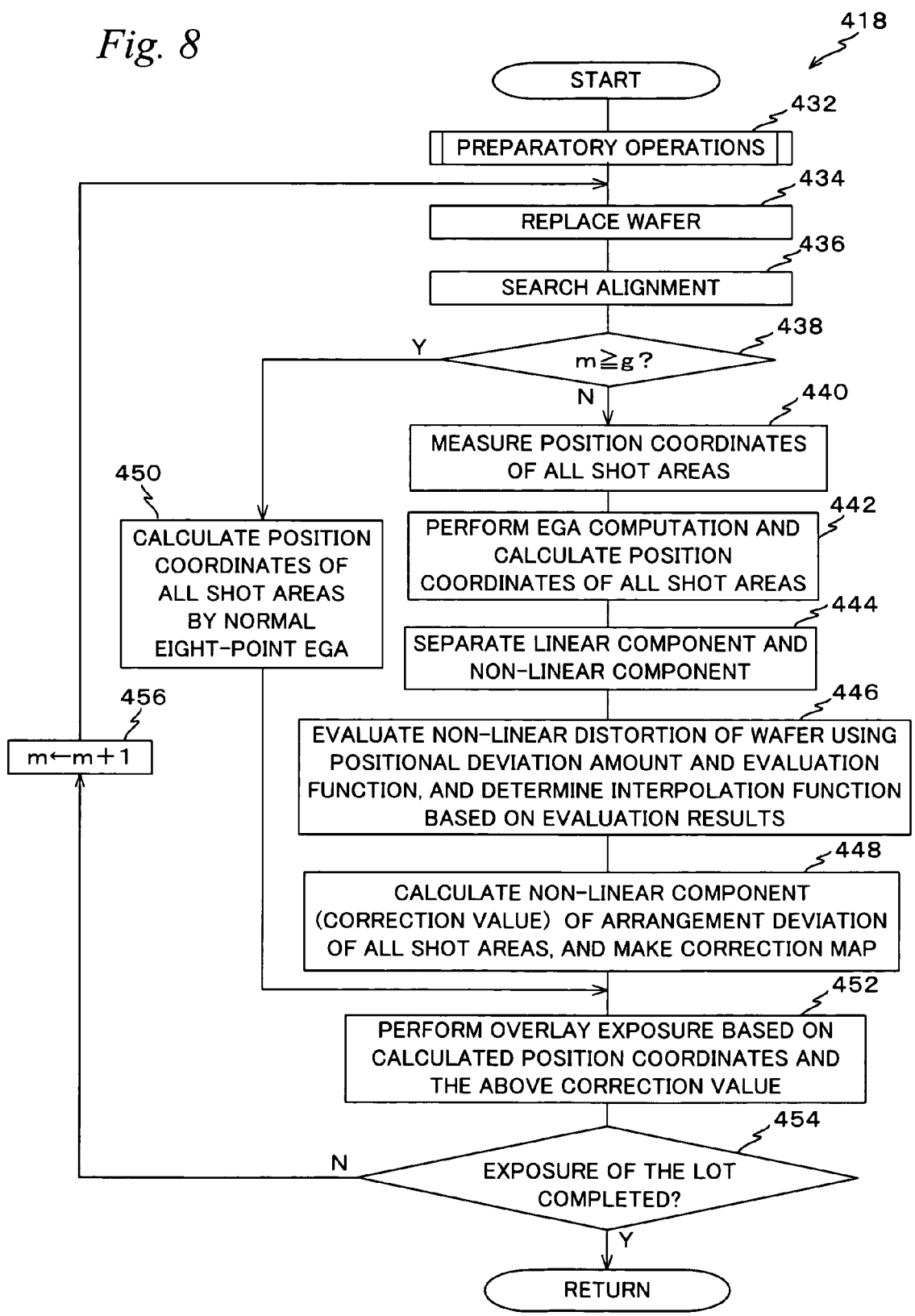
FIG. 8 is a flowchart showing a concrete processing algorithm of subroutine 418 in FIG. 7.

In subroutine 418, a processing shown in the flowchart in FIG. 8 is performed. As a premise, a count value M of a counter (not shown) indicating the wafer number within a lot is initialized to 'one'.

In subroutine 418, first, a predetermined preparatory operations are performed in subroutine 432. In subroutine 432, though it is omitted in the drawings, setting of exposure conditions, loading of reticle R, and reticle alignment and baseline measurement of alignment system AS are performed in the same manner as in steps 302, 304 and 306 in FIG. 5 described earlier.

In step 434, the wafer after the exposure processing (referred to as 'W'' for the sake of convenience) on wafer holder 25 in FIG. 2 is replaced with wafer W before exposure using a wafer loader (not shown). However, when there is not wafer W' on wafer holder 25, wafer W before exposure is simply loaded on wafer holder 25.

In step 436, search alignment is performed to wafer W loaded on wafer holder 25 in the same manner as descried earlier.

In step 438, the judgment is made of whether wafer W on wafer holder 25 (wafers stage WST) is the $g^{th}$ or succeeding wafer within the lot by judging whether or not count value m of the counter described earlier is equal to or greater than a predetermined value g. In this case, a predetermined value g is set in advance to any integer that is equal to or greater than two and equal to or less than twenty-five. The following description is made on the assumption that g equals two (g=2), for the sake of convenience. In this case, wafer W is a wafer at the head of the lot (the first wafer) and m equals one (m=1) by the initial setting. Therefore, the negative judgment is made in step 438, and the procedure proceeds to step 440.

In step 440, position coordinates on the stage coordinate system of all shot areas on wafer W are measured in the same manner as the measurement of the position coordinates of sample shot areas described previously.

In step 442, the EGA computation in equation (2) described earlier is performed based on the position coordinates of shot areas measured in the above step 440 and respective position coordinates in design, and six parameters 'a' to 'f' in equation (1) described earlier are calculated. Also, based on the calculation results and the position coordinates in design of shot areas, position coordinates (arrangement coordinates) of all shot areas are calculated, and then the calculation results, that is, the position coordinates (the estimate values) of all shot areas on wafer W are stored in a predetermined region of the internal memory.

In step 444, with respect to all shot areas on wafer W, a linear component and a non-linear component of positional deviation amount are separated. Specifically, a difference between the position coordinate of each shot area calculated in the above step 442 (the estimate value of positional information) and the position coordinate in design of each shot area is calculated as the linear component of positional deviation amount, and also a residual difference, which is obtained by subtracting the linear component from a difference between the position coordinates of all shot areas measured in actual in step 440 described earlier (actual measurement values of positional information) and corresponding position coordinates in design, is calculated as the non-linear component.

In step 446, based on the positional deviation amount from an individual fiducial position (a position in design) of each of all shot areas (a difference between a position coordinate of each shot area measured in actual (an actual measurement value of positional information) and its position coordinate in design), which has been calculated in the above step 442, and a predetermined evaluation function, a non-linear distortion of wafer W is evaluated. Based on the evaluation results, an interpolation function (a function that expresses a non-linear component of positional deviation amount (arrangement deviation)) is determined.

A processing in step 446 will be described below in detail referring to FIGS. 9 and 10.

As an evaluation function to evaluate the non-line component of wafer W, that is, the regularity and degree of the non-linear distortion, for example, an evaluation function $W_1(s)$ shown in the following equation (3) is used.

$$W_1(s) = \sum_{k=1}^{N} \frac{\left(\dfrac{\sum_{i \in s} \frac{\vec{r_i} \cdot \vec{r_k}}{|r_i||r_k|}}{\sum_{i \in s} 1}\right)}{N} \quad (3)$$

Figure 9:
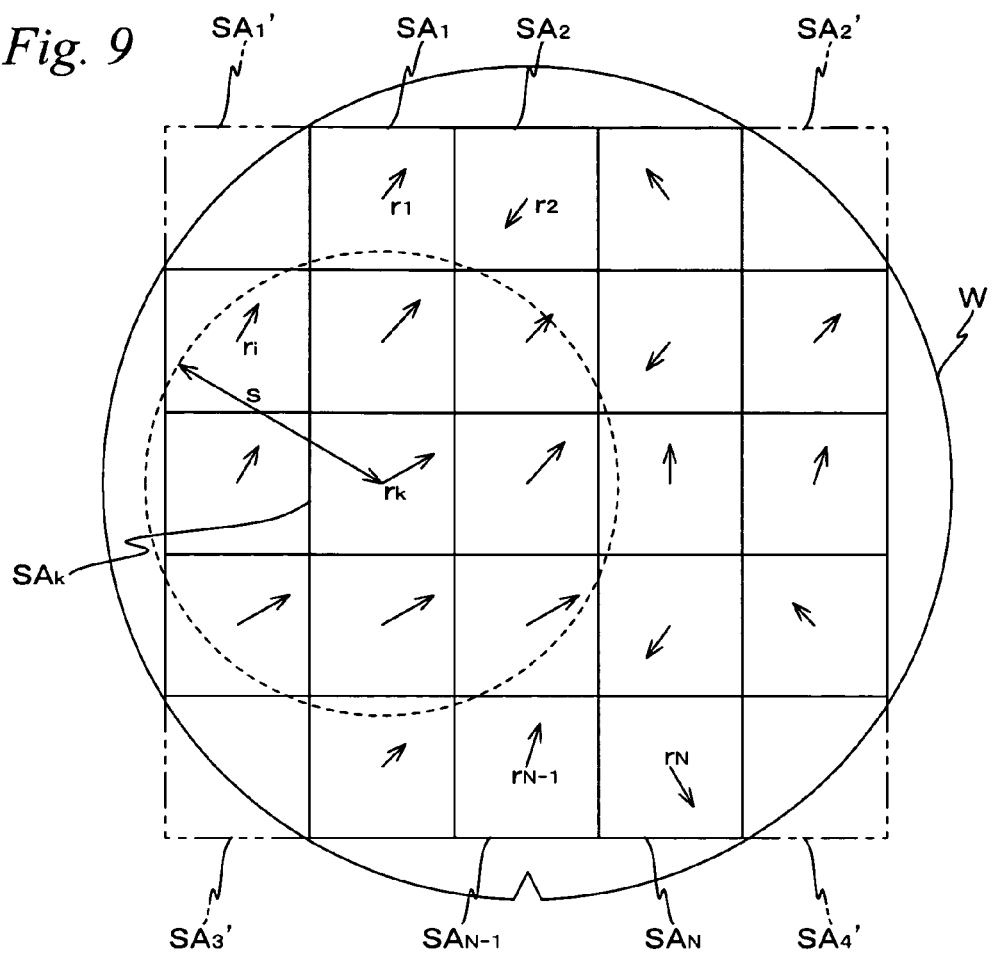
FIG. 9 is a planner view of a wafer W used to explain semantic content of an evaluation function in equation (3)

A planar view of wafer W used to explain semantic content of the evaluation function in the above equation (3) is shown in FIG. 9. In FIG. 9, shot areas SA (the total number of shot areas N) as a plurality of divided areas are formed in a matrix arrangement on wafer W. Vector $r_k$ (k=1, 2, ... i, ... N) indicated by an arrow in each shot area is a vector that shows a positional deviation amount (arrangement deviation) of each shot area.

In the above equation (3), N shows the total number of shot areas within wafer W, k shows the shot number of each shot area. And, s shows a radius of a circle whose center is at the center of a shot area $SA_k$ being focused in FIG. 9, and i shows the shot numbers of the shot areas existing within a circle having radius s from the $k^{th}$ shot area being focused. In addition, $\Sigma$ with i∈s in equation (3) means that the sum related to all shot areas existing within the circle having radius s from the $k^{th}$ shot area $SA_k$ being focused is taken.

Next, the function in brackets on the right-hand side in the above equation (3) is defined as in the following equation (4).

$$f_k(s) = \frac{\sum_{i \in s} \frac{\vec{r_i} \cdot \vec{r_k}}{|r_i||r_k|}}{\sum_{i \in s} 1} \quad (4)$$

Function $f_k(S)$ in the above equation (4) means a mean value of $\cos \theta_{ik}$ in the case when an angle between a positional deviation vector $r_k$ (a first vector) in the shot area being focused and a positional deviation vector $r_i$ in the shot areas on the periphery (within the circle having radius s) is $\theta_{ik}$. Therefore, when a value of function $f_k(s)$ is one, all the positional deviation vectors in all shot areas within the circle having radius s are pointed in the same direction. When a value of function $f_k(s)$ is zero, the positional deviation vectors in all shot areas within the circle having radius s are pointed in quite random directions. In other words, function $f_k(s)$ is a function to obtain the correlation related to the directions of positional deviation vector $r_k$ in the shot area being focused and each positional deviation vector $r_i$ in a plurality of shot areas on the periphery, which is an evaluation function to evaluate the regularity and degree of non-linear distortion of a partial area on wafer W.

Evaluation function $W_1(s)$ in the above equation (3) is nothing more or less than the average of function $f_k(S)$ when shot area $SA_k$ being focused is sequentially changed from shot area $SA_1$ to shot area $SA_n$.

Figure 10:
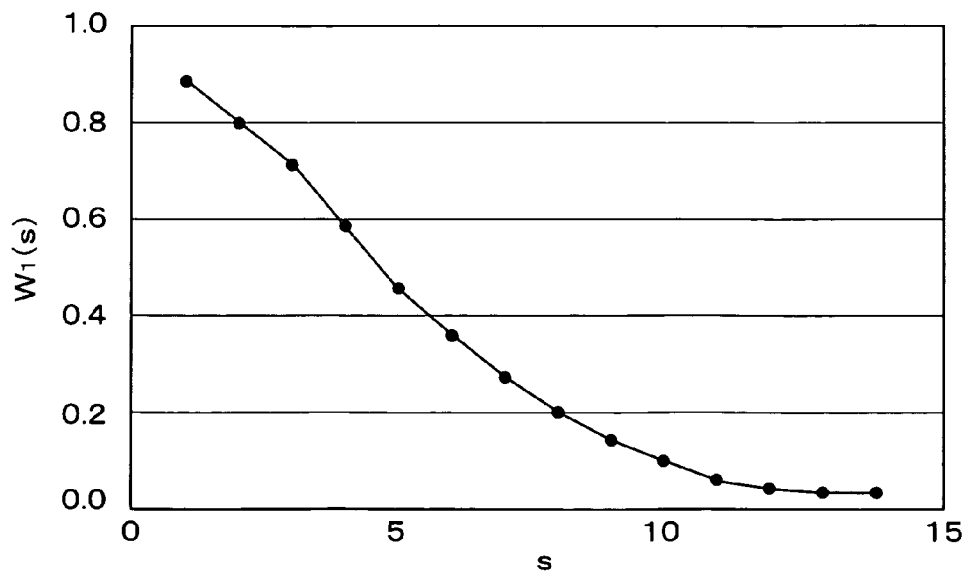
FIG. 10 is a diagram showing an example of a concrete evaluation function $W_1(s)$ corresponding to the wafer shown in FIG. 9.

FIG. 10 shows an example of a concrete evaluation function $W_1(s)$ corresponding to wafer W shown in FIG. 9. As is obvious from FIG. 10, according to evaluation function $W_1(s)$, since a value of $W_1(s)$ changes depending on a value of s, the regularity and degree of non-linear distortion of wafer W can be evaluated without relying on empirical rule. Therefore, by using the evaluation results, the interpolation function expressing a non-linear component of positional deviation amount (arrangement deviation) can be determined in the following manner.

First, as the interpolation function, for example, functions that are expanded in Fourier series as shown in the following equations (5) and (6) respectively are defined.

$$\delta_x(x, y) = \sum_{p=0}^{P} \sum_{q=0}^{Q} \left( \begin{array}{l} A_{pq} \cos\dfrac{2\pi px}{D} \cdot \cos\dfrac{2\pi qy}{D} + \\ B_{pq} \cos\dfrac{2\pi px}{D} \cdot \sin\dfrac{2\pi qy}{D} + \\ C_{pq} \sin\dfrac{2\pi px}{D} \cdot \cos\dfrac{2\pi qy}{D} + \\ D_{pq} \sin\dfrac{2\pi px}{D} \cdot \sin\dfrac{2\pi qy}{D} \end{array} \right) \quad (5)$$

$$A_{pq} = \frac{\sum_{x,y} \Delta_x(x, y) \cdot \cos\dfrac{2\pi px}{D} \cdot \cos\dfrac{2\pi qy}{D}}{\sum_{x,y} \cos\dfrac{2\pi px}{D} \cdot \cos\dfrac{2\pi qy}{D}}$$

$$B_{pq} = \frac{\sum_{x,y} \Delta_x(x, y) \cdot \cos\dfrac{2\pi px}{D} \cdot \sin\dfrac{2\pi qy}{D}}{\sum_{x,y} \cos\dfrac{2\pi px}{D} \cdot \sin\dfrac{2\pi qy}{D}}$$

$$C_{pq} = \frac{\sum_{x,y} \Delta_x(x, y) \cdot \sin\dfrac{2\pi px}{D} \cdot \cos\dfrac{2\pi qy}{D}}{\sum_{x,y} \sin\dfrac{2\pi px}{D} \cdot \cos\dfrac{2\pi qy}{D}}$$

$$D_{pq} = \frac{\sum_{x,y} \Delta_x(x, y) \cdot \sin\dfrac{2\pi px}{D} \cdot \sin\dfrac{2\pi qy}{D}}{\sum_{x,y} \sin\dfrac{2\pi px}{D} \cdot \sin\dfrac{2\pi qy}{D}}$$

$$\delta_x(x, y) = \sum_{p=0}^{P} \sum_{q=0}^{Q} \left( \begin{array}{l} A'_{pq} \cos\dfrac{2\pi px}{D} \cdot \cos\dfrac{2\pi qy}{D} + \\ B'_{pq} \cos\dfrac{2\pi px}{D} \cdot \sin\dfrac{2\pi qy}{D} + \\ C'_{pq} \sin\dfrac{2\pi px}{D} \cdot \cos\dfrac{2\pi qy}{D} + \\ D'_{pq} \sin\dfrac{2\pi px}{D} \cdot \sin\dfrac{2\pi qy}{D} \end{array} \right) \quad (6)$$

$$A'_{pq} = \frac{\sum_{x,y} \Delta_y(x, y) \cdot \cos\dfrac{2\pi px}{D} \cdot \cos\dfrac{2\pi qy}{D}}{\sum_{x,y} \cos\dfrac{2\pi px}{D} \cdot \cos\dfrac{2\pi qy}{D}}$$

$$B'_{pq} = \frac{\sum_{x,y} \Delta_y(x, y) \cdot \cos\dfrac{2\pi px}{D} \cdot \sin\dfrac{2\pi qy}{D}}{\sum_{x,y} \cos\dfrac{2\pi px}{D} \cdot \sin\dfrac{2\pi qy}{D}}$$

-continued $$C'_{pq} = \frac{\sum_{x,y} \Delta_y(x,y) \cdot \sin\frac{2\pi px}{D} \cdot \cos\frac{2\pi qy}{D}}{\sum_{x,y} \sin\frac{2\pi px}{D} \cdot \cos\frac{2\pi qy}{D}}$$

$$D'_{pq} = \frac{\sum_{x,y} \Delta_y(x,y) \cdot \sin\frac{2\pi px}{D} \cdot \sin\frac{2\pi qy}{D}}{\sum_{x,y} \sin\frac{2\pi px}{D} \cdot \sin\frac{2\pi qy}{D}}$$

In the above equation (5), $A_{pq}$, $B_{pq}$, $C_{pq}$ and $D_{pq}$ are Fourier series coefficients, and $\delta_x(x, y)$ shows an X component (an interpolation value, i.e. a correction value) of a non-linear component of positional deviation amount (arrangement deviation) of a shot area at a coordinate (x, y). $\Delta_x(x,y)$ is an X component of a non-linear component of positional deviation amount (arrangement deviation) of a shot area at a coordinate (x, y) calculated in step 444 previously described.

Likewise, in the above equation (6), $A_{pq}'$, $B_{pq}'$, $C_{pq}'$ and $D_{pq}'$ are Fourier series coefficients, and $\delta_y(x, y)$ shows a Y component (an interpolation value, i.e. a correction value) of a non-linear component of positional deviation amount (arrangement deviation) of a shot area at a coordinate (x, y). $\Delta_y(x, y)$ is a Y component of a non-linear component of positional deviation amount (arrangement deviation) of a shot area at a coordinate (x, y) calculated in step 444 previously described. In equations (5) and (6), D shows a diameter of wafer W.

In the functions of the above equations (5) and (6), it is important to determine the maximum values $p_{max}=P$ and $q_{max}=Q$ of parameters p and q which determine how many periods the variation of positional deviation amount (arrangement deviation) of shot area exists per diameter of a wafer.

The reason is as follows. That is, it is considered here that a non-linear component of arrangement deviation of a shot area which is obtained with respect to all shot areas on wafer W is expanded using the above equations (5) and (6). In this case, it is assumed that the variation of positional deviation amount (arrangement deviation) of a shot area occurs in each shot area. In the case when the maximum value $p_{max}=P$, $q_{max}=Q$ of parameters p and q are made the maximum values corresponding to the case when a period is a shot pitch, the case is considered where a so-called 'skipping shot' in which an alignment error is greater compared with other shot areas is included as any shot area. Such a skipping shot occurs due to measurement error caused by break of a wafer mark and the like or due to local non-linear distortion caused by foreign particles on the rear surface of a wafer and the like. In such a case, a non-linear component is expressed in the interpolation function including the measurement results of the skipping shot. In order to prevent it, P and Q need to be values smaller than the above maximum values corresponding to the case when a period is a shot pitch. In other words, it is preferable that a high-frequency component caused by the measurement results of the skipping shot is removed and only an optimal low-frequency component is expressed in the interpolation function.

For the reason, in the embodiment, the maximum values $p_{max}=P$ and $q_{max}=Q$ of parameters p and q are determined using evaluation function $W_1(s)$ in equation (3) described earlier. When the maximum values are determined in this manner, even if a skipping shot exists, there hardly is a correlation between the skipping shot and the shot areas on the periphery. Accordingly, the measurement results of the skipping shot do not cause a value of $W_1(s)$ shown in equation (3) to increase, and as a consequence, it becomes possible to decrease or remove effect of the skipping shot by using equation (3). In other words, in FIG. 10, for example, when areas within a circle having radius s of $W_1(s) > 0.7$ deem to be correlated with one another and it is considered that the areas are expressed using one interpolation value, s equals 3 as in FIG. 10. P and Q can be described as follows using this value s=3, and diameter D of a wafer.

$$P=D/s=D/3, Q=D/s=D/3 \tag{7}$$

In this manner, optimal P and Q can be determined and the interpolation functions in equations (5) and (6) can be determined.

Referring back to FIG. 8, in step 448, a computation is performed by assigning the X component $\Delta_x(x, y)$ and the Y component $\Delta_y(x, y)$ of the non-linear component of positional deviation amount (arrangement deviation) of a shot area at the coordinate (x, y) calculated in step 444 to the interpolation functions in (5) and (6), respectively. By performing the computation, the X component (an interpolation value, i.e. a correction value) and the Y component (an interpolation value, i.e. a correction value) of the non-linear component of arrangement deviation of all shot areas on wafer W are calculated, and a correction map as correction information is made in which the non-linear component (the X component and the Y component) of arrangement deviation of each shot area is a correction value of each shot area. Then, after the correction map made out is stored in a map storing region corresponding to process name n (process name A in this case) that has been obtained in step 412 in the data table described earlier, the procedure proceeds to step 452.

In step 452, based on the arrangement coordinate of all shot areas stored in a predetermined region in the internal memory described previously, and the correction value of a non-linear component of positional deviation amount of each shot area within the correction map stored in the map storing region corresponding to process name n (process name A in this case) obtained in step 412 in the data table, an overlay correction position is calculated in which a positional deviation amount (a linear component and a non-linear component) of each shot area is corrected. Also, based on data of the overlay correction position and the baseline measured in advance, exposure operation by the step-and-scan method is performed by repeating an operation for sequentially moving wafer W to an acceleration starting position (a scanning starting position) to expose each shot area on wafer W and an operation for transferring a reticle pattern on the wafer while synchronously moving reticle stage RST and wafer stage WST in a scanning direction. With this operation, the exposure processing to wafer W at the head of a lot (the first wafer in the lot) is completed.

In step 454, the judgment is made of whether or not exposure of all wafers in the lot is completed by judging whether or not count value m of the counter described earlier is greater than 24 (m>24). In this case, because m equals one (m=1), the negative judgment is made and the procedure proceeds to step 456. And, after count value m of the counter is incremented (m←m+1), the procedure returns to step 434.

In step 434, the wafer at the head of the lot after the exposure processing on wafer holder 25 in FIG. 2 is replaced with the second wafer, using a wafer loader (not shown).

In step 436, in the same manner as is described previously, search alignment is performed to wafer W (in this case, the second wafer in the lot) loaded on wafer holder 25.

In step 438, the judgment is made of whether or not wafer W on wafer holder 25 (wafer stage WST) is the $g^{th}$ (=second) or succeeding wafer in the lot by judging whether or not count value m of the counter described earlier is equal to or greater than a predetermined value g (=2). In this case, because wafer W is the second wafer in the lot and m equals two (m=2), the affirmative judgment is made in step 438 and the procedure proceeds to step 450.

In step 450, using the normal eight-point EGA, position coordinates of all shot areas on wafer W is calculated. More specifically, using alignment system AS in the same manner as described earlier, wafer marks arranged on eight shot areas (sample shot areas) that have been selected in advance on wafer W are measured, and position coordinates on the stage coordinate system of the sample shot areas are obtained. Then, the EGA computation in equation (2) described earlier is performed based on the obtained position coordinates of the sample shot areas and respective position coordinates in design, and six parameters in equation (1) described earlier are calculated. Also, based on the calculation results and the position coordinates in design of the shot areas, position coordinates (arrangement coordinates) of all shot areas is calculated. Then, after the calculation results are stored in a predetermined region of the internal memory, the procedure proceeds to step 452.

In step 452, in the same manner as is described previously, an exposure processing is performed to wafer W that is the second wafer in the lot by the step-and-scan method. When wafer W is moved to a scanning starting position (an acceleration starting position) for exposure of each shot area, based on the arrangement coordinates of all shot areas stored in a predetermined region within the internal memory and the correction value of a non-linear component of positional deviation amount of each shot area in the correction map within the data table described earlier, an overlay correction position is calculated in which a positional deviation amount (a linear component and a non-linear component) of each shot area is corrected.

When exposure to the second wafer W in the lot is completed as is described above, the procedure proceeds to step 454, and the judgment is made of whether or not exposure of all wafers in the lot is completed. Since the judgment is negative in this case, after count value m is incremented in step 456, the procedure returns to step 434. Afterward, until exposure to all wafers in the lot is completed, a loop processing of steps 434→436→438→450→452→454→456 and judgment are repeated.

When exposure to all wafers in the lot is completed and the affirmative judgment is made in step 454, the processing of the subroutine in FIG. 8 ends and the procedure returns to step 428 of subroutine 406 in FIG. 7.

In step 428, after count value M of the counter is incremented, the procedure proceeds to step 430, in which count value M is set to parameter $M_n$ in the data table corresponding to process name n (process name A in this case) obtained in step 412. After that, the processing of subroutine 406 ends and the procedure returns to step 410 of the main routine in FIG. 6.

In step 410, after host computer 150 is notified via LAN 160 and terminal server 140 that exposure is completed, a series of processing ends.

While exposure apparatus $100_1$ performs the processing in steps 402, 404, 406 and 410 to wafers in the first lot in the case of process name A, host computer 150 waits until exposure is completed in step 212 in FIG. 4, as is described earlier.

When host computer 150 receives a notice of exposure completion from main control system 20 of exposure apparatus $100_1$ in the above step 410, a waiting state in step 212 of host computer 150 is canceled and host computer 150 repeatedly performs the processing in step 202 and succeeding steps to wafers in the next and succeeding lots.

It is assumed that during repetition of the processing by host computer 150 as described above, after a predetermined period time, the processing to a wafer in a certain lot starts, the processing proceeds in a route of steps 202→204→206→210, and a process program corresponding to process name A is designated along with exposure instructions with respect to main control system 20 of exposure apparatus $100_1$ in step 210.

When receiving the above exposure instructions, main control system 20 of exposure apparatus $100_1$ stars the processing in step 402 and succeeding steps in FIG. 6. When the judgment is affirmative in step 404, the procedure proceeds to a subroutine of step 406.

In the subroutine of step 406, in step 412 of FIG. 7, process name A is obtained from a process program file corresponding to setting instruction information of exposure conditions given together with the exposure instructions by host computer 150 in step 210 descried earlier.

In step 414, a value ('two' in this case) of parameter $M_n$, which corresponds to process name A obtained in step 412, within the data table is set to count value M of the counter that indicates the order of lots (M←$M_n$(=2)).

In step 416, the judgment is made of whether or not counter value M is one, that is, whether or not a lot subject to exposure is the first lot to which a processing of the obtained process name n (process name A in this case) is performed. In this case, because M equals two (M=2), the negative judgment is made and the procedure proceeds to step 420.

In step 420, the judgment is made of whether or not count value M is K (K is an integer set in advance that is equal to or greater than two, and in this case K equals four (K=4) as an example). In this case, since M equals two (M=2), the judgment is negative and the procedure proceeds to a subroutine of lot processing without updating a map in step 422.

Figure 11:
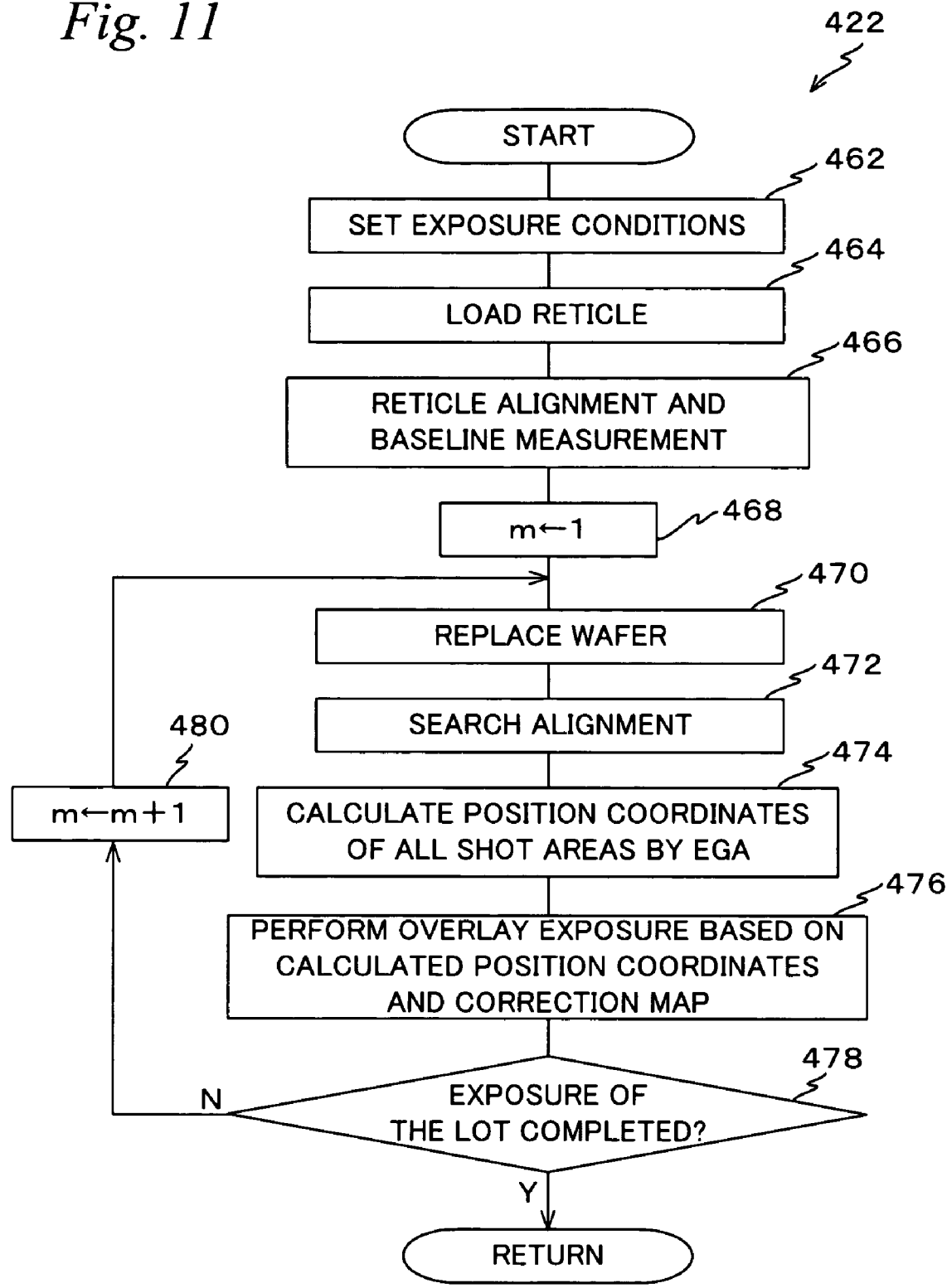
FIG. 11 is a flowchart showing a concrete processing algorithm of subroutine 422 in FIG. 7.

In subroutine 422, the processing shown in the flowchart in FIG. 11 is performed.

In subroutine 422, in steps 462 to 474, the same processing is performed as of steps 302 to 314 described previously (refer to FIG. 5). As a consequence, in a state where the processing in step 474 ends, arrangement coordinates (estimate values of positional information) of all shot areas on wafer W at the head of the lot are calculated and stored in a predetermined region in the internal memory.

In step 476, based on the arrangement coordinates (the estimate values of positional information) of all shot areas stored in a predetermined region in the internal memory describe earlier, the correction map stored at the time in the map storing region of process name A in the data table describe earlier, and the baseline measured in advance, the exposure operation by the step-and-scan method is performed by repeating an operation for sequentially moving wafer W to an acceleration starting position (a scanning starting position) to expose each shot area on wafer W and an operation for transferring a reticle pattern onto the wafer while synchronously moving reticle stage RST and wafer stage WST in a scanning direction.

In other words, as is obvious from the EGA computation described previously, the arrangement coordinates (the estimate values of positional information) of all shot areas are values obtained by correcting a linear component of positional deviation amount of each shot area. Based on the estimate values and the correction value of a non-linear component of positional deviation amount of each shot area obtained from the correction map, a position coordinate of each shot area is obtained in which a linear component and a non-linear component of positional deviation amount of each shot is corrected. And, based on the position coordinate and the baseline, a position coordinate at the center of each shot area on the stage coordinate system can be obtained. Then, based on this position coordinate, a length in the scanning direction of the shot area, and a distance between the known acceleration starting position and the known acceleration ending position, an acceleration staring position to expose each shot area on wafer W is calculated.

Therefore, when the exposure processing is performed to wafer W at the head o the lot (the first wafer in the lot) described above, exposure with high precision is performed in which an overlay error caused by a positional error (a linear component and a non-linear component) between shot areas that have been already formed on wafer W is corrected.

In step 478, the judgment is made of whether or not exposure of all wafers within the lot is completed by judging whether or not count value m of the counter described earlier is greater than twenty-four (m>24). In this case, because m equals one (m=1), the negative judgment is made. Then the procedure proceeds to step 480, in which count value m of the counter is incremented (m←m+1), and afterward, a loop processing of the above steps 470 to 480 and judgment are repeatedly performed until exposure of all wafers in the lot is completed.

When exposure of all wafers in the lot is completed and the affirmative judgment is made in step 478, the processing of subroutine 422 ends, and the procedure returns to step 428 in FIG. 7.

After count value M of the counter is incremented in step 428, the procedure proceeds to step 430, in which count value M is set to parameter $M_n$ within the data table corresponding to process name n (process name A in this case) obtained in step 412. Then, the processing of subroutine 406 ends and the procedure returns to step 410 of the main routine in FIG. 6.

In step 410, after host computer 150 is notified via LAN 160 and terminal server 140 that exposure is completed, a series of processing ends.

Then, during repetition of the processing by host computer 150 as described earlier (refer to FIG. 4), every time when the processing proceeds in a route of steps 202→204→206→210 with respect to a wafer in a certain lot, and a process program corresponding to process name A is designated along with exposure instructions with respect to main control system 20 of exposure apparatus $100_1$ in step 210, and the affirmative judgment is made in step 404, main control system 20 of exposure apparatus $100_1$ judges whether or not M equals K(=4) (M=K(4)) in step 420 after the processing in step 412 (to obtain process name A), 414 and 416, in subroutine 406 in FIG. 7.

In a cycle in which the third lot to which a processing of process name A is performed becomes a lot subject exposure and count value M is set to $M_n$=3 in step 414, the judgment is negative in step 420, and a processing in a route of subroutine 422→step 428→step 430 is performed.

Meanwhile, in a cycle in which the fourth lot to which a processing of process name A is performed becomes a lot subject exposure and count value M is set to $M_n$=4 in step 414, the judgment is affirmative in step 420, and the procedure proceeds to a subroutine of a lot processing with updating a map in step 424.

Figure 12:
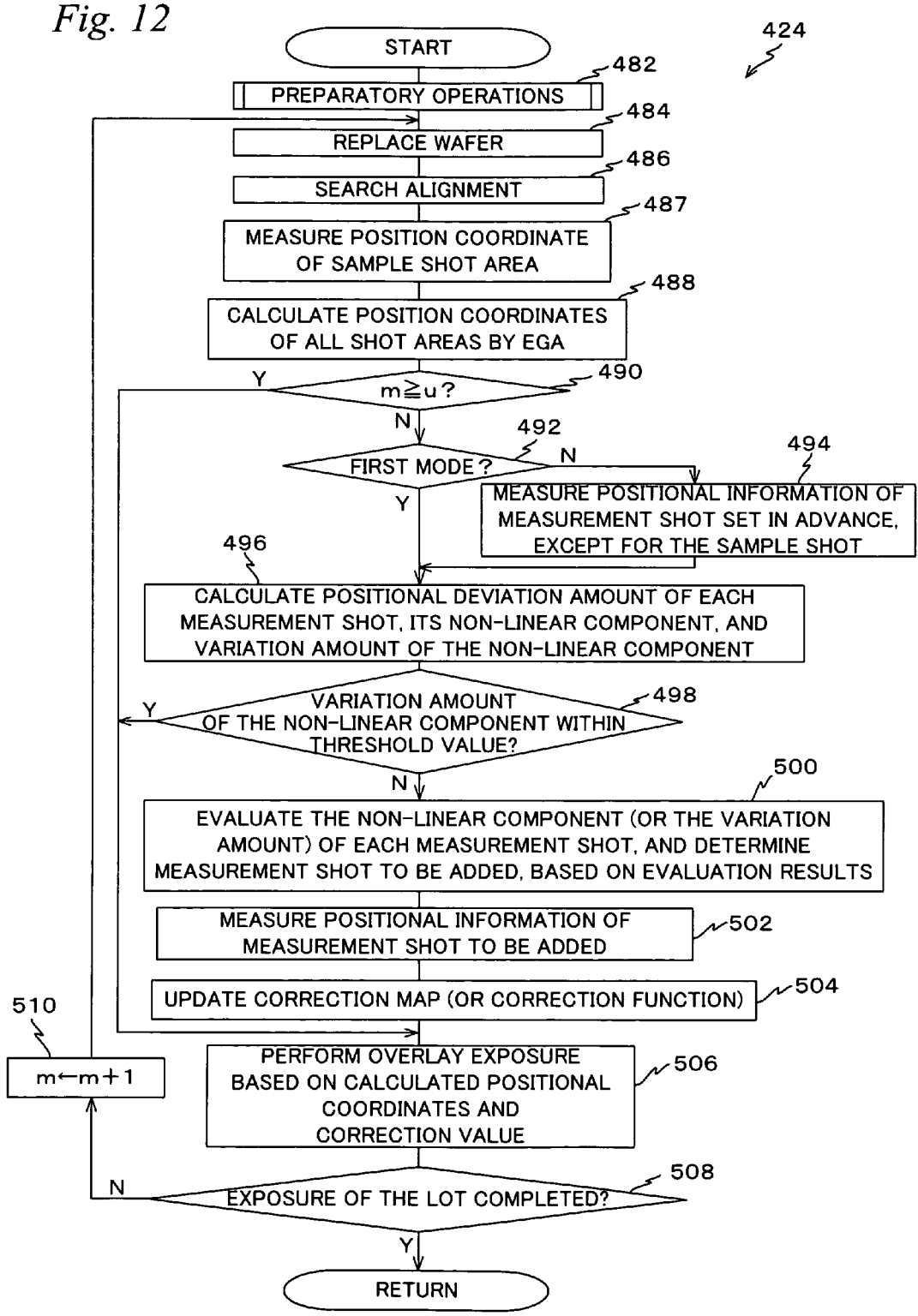
FIG. 12 is a flowchart showing a concrete processing algorithm of subroutine 424 in FIG. 7.

In subroutine 424, a processing shown in the flowchart in FIG. 12 is performed. As a premise, a count value m of a counter (not shown) that indicates the wafer number within a lot is to be initialized to one.

In subroutine 424, first of all, predetermined preparatory operations are performed in subroutine 482. In subroutine 482, though it is omitted in the drawings, setting of exposure conditions, loading of reticle R, and reticle alignment and baseline measurement of alignment system AS are performed in the same manner as in steps 302, 304 and 306 in FIG. 5 described earlier.

In step 484, the wafer after the exposure processing (referred to as 'W'' for the sake of convenience) on wafer holder 25 in FIG. 2 is replaced with wafer W before exposure, using a wafer loader (not shown). However, when wafer W' does not exist on wafer holder 25, wafer W before exposure is simply loaded on wafer holder 25.

In step 486, search alignment is performed to wafer W loaded on wafer holder 25 in the same manner as is described earlier.

In step 487, using alignment system AS in the same manner as previously described, wafer marks arranged in eight shot areas (sample shot areas) selected in advance on wafer W are measured, and position coordinates of these sample shots areas on the stage coordinate system are obtained.

In step 488, the EGA computation of equation (2) described earlier is performed based on the obtained position coordinates of the sample shot areas and their position coordinates in design, and six parameters in equation (1) described previously are calculated. Also, based on the calculation results and the position coordinates in design of the shot areas, position coordinates (arrangement coordinates) of all shot areas are calculated. After the calculation results are stored in a predetermined region in the internal memory, the procedure proceeds to step 490.

In step 490, the judgment is made of whether or not wafer W on wafer holder 25 (safer stage WST) is the $u^{th}$ or succeeding wafer within the lot by judging whether or not count value m of the counter described earlier is equal to or greater than a predetermined value u. In this case, a predetermined value u is set in advance to an integer that is equal to or greater than two and equal to or smaller than twenty-five. For the sake of convenience, the following description will be made on the assumption that u equals two (u=2). In this case, since wafer W is a wafer at the head of the lot (the first wafer) and m equals one (m=1) by the initial setting, the judgment is negative in step 490 and the procedure proceeds to step 492.

In step 492, the judgment is made of whether or not a mode of simplified check of update of the correction map is set to a first mode.

In the embodiment, it is assumed that as the mode of simplified check of update of the correction map, the first mode and a second mode can selectively be set by input by an operator via an input/output device (not shown) and either of modes is set by the operator.

The first mode is a mode in which a simplified check regarding the necessity of update of the correction map is performed using the sample shot areas themselves in wafer alignment by the EGA method as measurement shot areas, and the second mode is a mode in which the above simplified check is performed adding at least one shot area as a measurement shot area besides the sample shot area. In this case, as a shot area to be added as a measurement shot area, one or more shot areas that are selected out of the peripheral shot areas on the wafer besides the sample shot area are to be set in advance.

And, when the judgment is negative in step 492, that is, the second mode is set, the procedure proceeds to step 494, in which positional information (actual measurement value) of the measurement shot area that has been set in advance besides the sample shot areas is measured in the same manner as the measurement of the position coordinates of the sample shot areas described earlier. Then, the procedure proceeds to step 496.

On the other hand, when the judgment is affirmative in the above step 492, that is, the first mode is set, the procedure directly proceeds to step 496.

In step 496, a positional deviation amount, its non-linear component, and a variation amount of the non-linear component are calculated regarding each measurement shot area. Specifically, a difference between the position coordinate (the actual measurement value) of each measurement shot area measured in actual in step 487 (and step 494) described earlier and the corresponding position coordinate in design is calculated as a positional deviation amount (a positional deviation amount from an individual fiducial position) of each measurement shot area. Also, a difference between the position coordinate (the actual measurement value) of each measurement shot area and the position coordinate (the estimate value) calculated in the above step 488 is calculated as a non-linear component of positional deviation amount of each measurement shot area. Further, a difference between the calculated non-linear component of positional deviation amount of each measurement shot area and a correction value of non-linear component of positional deviation amount of each measurement shot area included in the correction map within the data table described previously (or, the value of non-linear component of positional deviation amount of each measurement shot area obtained by the processing in step 444 described earlier when making the correction map) is calculated as a variation amount of the non-linear component of positional deviation amount.

In step 498, by comparing the variation amount of non-linear component of positional deviation amount of each measurement shot area calculated in the above step 496 to a predetermined threshold, the judgment is made of whether or not the variation amount of non-linear component of positional deviation amount in all measurement shot areas is within the threshold. In step 498, instead of the above processing, a difference between the positional deviation amount of each measurement shot area obtained during the processing of step 444 described earlier when making the correction map, and the positional deviation amount of each measurement shot area calculated in the above step 496 may be calculated as a variation amount of positional deviation amount of each measurement shot area, and the variation amount may be compared to a predetermined threshold.

When the judgment is affirmative in the above step 498, since it can be judged that update of the correction map is not necessary, the procedure proceeds to step 506. In this case, a correction map used in step 506 to be described later is the correction map (the correction map calculated for the first lot to which a processing of process name n is performed) used until $M_n$ becomes equal to 3 ($M_n=3$).

Meanwhile, when the judgment is negative in the above step 498, the correction map is updated by sequentially performing the processing of steps 500, 502 and 504, then the procedure proceeds to step 506.

In other words, in step 500, the non-linear component (or its variation amount) of positional deviation amount calculated with respect to each measurement shot area in the above step 496 is evaluated in a predetermined method, and based on the evaluation results, a measurement shot area to be added is determined.

As the evaluation method in step 500, various methods can be employed.

a. For example, as a result of the comparison in the above step 498, whether or not the variation amount of non-linear component of positional deviation amount of each measurement shot area exceeds a threshold serves as an evaluation criteria. Ad as a consequence of the evaluation, a plurality of shot areas having the measurement shot area exceeding the threshold in the center are determined, as new measurement shot areas to be added. Or, whether or not the positional deviation amount of each measurement shot area or its non-linear component calculated in the above step 496 exceeds a threshold serves as an evaluation criteria. And, as a consequence of the evaluation, a plurality of shot areas having the measurement shot area exceeding the threshold in the center are determined, as new measurement shot areas to be added. Or, When it is assumed that each measurement shot area is a shot area being focused, a vector of its positional deviation amount or its non-linear component (or their variation amount) is $r_k$, and a vector of a positional deviation amount or its non-linear component (or their variation amount) of a plurality of adjacent measurement shot areas is $r_i$, a plurality of shot areas having the measurement shot area in the center, in which a correlation value related to a direction of vector $r_k$ and a direction of vector $r_i$ calculated using function $f_k(s)$ in equation (4) described previously is smaller than a certain value, are determined as new shot measurement areas to be added. In these cases, a range of new measurement shot areas to be added may be calculated using the evaluation function described earlier.

b. Besides, a plurality of shot areas on wafer W are grouped in advance into four blocks belonging to the first to fourth quadrants, by two axes orthogonal to each other (an $\alpha$ axis almost parallel to the X axis and a $\beta$ axis almost parallel to the Y axis) with the origin at the center of the wafer. Then, with regard to only the block to which measurement shot areas whose variation amount of non-linear component of positional deviation amount (or variation amount of positional deviation amount) exceeds the threshold belong as a result of the comparison in the above step 498, shot areas other than the measurement shot areas belonging to the block may be determined as new measurement shot areas.

c. In addition, taking into consideration the empirical fact that a non-linear distortion of wafer W increases toward the periphery of the wafer, by using the correction value of a non-linear component of positional deviation amount of each shot area on wafer W within the correction map before update and making a shot area at the wafer center be a shot area being focused, based on evaluation function $f_k(s)$ in equation (4) described earlier, a plurality of shot areas on wafer W are grouped into a plurality of blocks in a direction in which a distance s from the wafer center changes. Then, with regard to only the block to which measurement shot areas whose non-linear component (or its variation amount) of each measurement divided area exceeds the threshold belong, shot areas other than the measurement shot areas belonging to the block may be determined as new measurement shot areas.

d. As a matter of course, the present invention is not limited to the above methods a to c, and based on he evaluation results using a predetermined criteria of the positional deviation amount or its non-linear component (or their variation amount) of each measurement divided area calculated, or based on the evaluation results using a predetermined criteria of the positional deviation amount or its non-linear component (or their variation amount) of each shot area included in the correction map before update, a plurality of shot areas may be determined as new measurement shot areas to be added.

In either case, in step 502, positional information (a position coordinate on the stage coordinate system) of each of the new measurement shot areas to be added that have been determined in the above step 500 is measured in the same manner as measurement of the position coordinates of sample shot areas described above.

In step 504, the correction map stored in the map storing region of process name A within the data table described above is updated. Specifically, a difference between a difference between the position coordinate (the actual measurement value of positional information) of each new measurement shot area measured in the above step 502 and the corresponding design value of each new measurement shot area (a positional deviation amount of each new measurement shot area with respect to an individual fiducial position), and the position coordinate (the estimate value of positional information) of each measurement shot area calculated in the above step 488 is calculated, as a non-linear component (an X component and a Y component) of positional deviation amount of each new measurement shot area. By assigning a value of the non-linear component (the X component and the Y component) of positional deviation amount of each new measurement shot area measured here and a value of the non-linear component (the X component and the Y component) of positional deviation amount of each measurement shot area calculated in the above step 496 to the interpolation function determined in step 446 described earlier, a non-linear component (a correction value) of arrangement deviation related to each measurement shot area is calculated.

In addition, using the calculated non-linear component (the correction value) of arrangement deviation of each measurement shot area, a non-linear component (a correction value) of arrangement deviation related to other shot areas than the measurement shot areas on wafer W is calculated by interpolating computation. As the interpolating computation, a method may be employed in which with respect to a center position of each shot area, based on the non-linear component (the correction value) of arrangement deviation of a plurality of measurement shot areas existing on the periphery, a correction value of the center position of each shot area is calculated by weighted average computation assuming Gaussian distribution, which is disclosed in, for example, the U.S. patent application Publication No. U.S. 2002/0042664 described earlier. A range of a plurality of measurement shot areas existing on the periphery that are subject to the weighted averaging computation may be calculated using the above-described evaluation function. Or, with respect to a center position of each shot area, a simple average of the correction value of measurement shot areas within the range calculated using the evaluation function may used.

And, using the correction value related to all shot areas on wafer W calculated in the above manner, the correction map is updated by overwriting the correction value of each shot area within the correction map stored in the map storing region of process name A of the data table described previously.

In step 506, as in step 476 described earlier, based on the arrangement coordinates (the estimate values) of all shot areas stored in a predetermined region within the internal memory described earlier, the correction map stored at the time in the map storing region of process name A of the data table (in the case when the correction map is updated, the correction map after the latest update), and the baseline measured in advance, the exposure operation by the step-and-scan method is performed by repeating an operation for sequentially moving wafer W to an acceleration starting position (a scanning starting position) to expose each shot area on wafer W and an operation for transferring a reticle pattern onto the wafer while synchronously moving reticle stage RST and wafer stage WST in a scanning direction. In this case, exposure with high precision is performed in which an overlay error caused by a positional error (a linear component and a non-linear component) between shot areas that have already been formed on wafer W is corrected.

In step 508, the judgment is made of whether or not exposure of all wafers within the lot is completed by judging whether or not count value m of the counter described earlier is greater than twenty-four (m>24). In this case, because m equals 1 (m=1), the negative judgment is made and the procedure proceeds to step 510. After count value m of the counter is incremented (m←m+1), the procedure returns to step 484.

In step 484, the wafer after the exposure processing at the head of the lot on wafer holder 25 in FIG. 2 is replaced with the second wafer W in the lot, using a wafer loader (not shown).

In step 486, search alignment is performed to wafer W (in this case, the second wafer in the lot) loaded on wafer holder 25, in the same manner as is described above.

In steps 487 and 488, in the same manner as is described earlier, position coordinates of all shot areas on wafer W are calculated by the normal eight-point EGA, and the calculation results are stored in a predetermined region of the internal memory.

In step 490, the judgment is made of whether wafer W on wafer holder 25 (wafers stage WST) is the $u^{th}$ (=second) or succeeding wafer within the lot by judging whether or not count value m of the counter described earlier is equal to or greater than a predetermined value u (=2). In this case, since wafer W is the second wafer in the lot and m equals 2 (m=2), the affirmative judgment is made in step 490 and the procedure jumps to step 506.

In step 506, the exposure operation by the step-and-scan method is performed to the $m^{th}$ (in this case, the second) wafer W in the lot, in the same manner as described earlier, and exposure with high precision is performed in which an overlay error caused by a positional error (a linear component and a non-linear component) between shot areas that have already been formed on wafer W is corrected.

When exposure to the second wafer W in the lot is completed as is described above, the procedure proceeds to step 508, in which the judgment is made of whether or not exposure of all wafers in the lot is completed. Since the judgment is negative in this case, after count value m is incremented in step 510, the procedure returns to step 484. Afterward, a loop processing of steps 484→486→487→488→490→506→508→510 and judgment are repeated, until exposure to all wafers in the lot is completed.

When exposure to all wafers in the lot is completed and the affirmative judgment is made in step 508, the processing of the subroutine in FIG. 12 ends and the procedure returns to step 426 of subroutine 406 in FIG. 7.

In step 426, after count value M of the counter is initialized to one (M←1), the procedure proceeds to step 428.

In step 428, after count value M of the counter is incremented, the procedure proceeds to step 430, in which count value M is set to parameter $M_n$ in the data table corresponding to process name n (process name A in this case) obtained in step 412. After that, the processing of subroutine 406 ends and the procedure returns to step 410 of the main routine in FIG. 6.

As is obvious from the description so far, afterwards, the exposure processing of process name A is instructed from host computer 150, and the subroutine of a lot processing with updating a map in step 424 once in (K−1)=3 lots with respect to each lot to which the processing of step 406 is executed.

With regard to other lots ((K−2)=2 lots in between lots to which the subroutine of step 424 is executed), the subroutine of a lot processing without updating a map in step 422 is executed.

When K equals two (K=2), the exposure processing of process name A is instructed from host computer 150, and with regard to each lot to which the processing of step 406 is executed, the subroutine of a lot processing with making a map in step 418 is executed to the first lot, then the subroutine of lot processing with updating a map in step 424 is repeatedly executed to all of the second and succeeding lots. In this case, the subroutine of step 422 is not executed.

Meanwhile, when the judgment is negative in step 404 described previously (refer to FIG. 6), that is, as a result of judging whether or not an overlay error between the successive lots is greater compared to a predetermined threshold, the negative judgment is made, the procedure proceeds to subroutine 408 in which the overlay error is corrected using the second grid correction function and exposure is performed.

Figure 13:
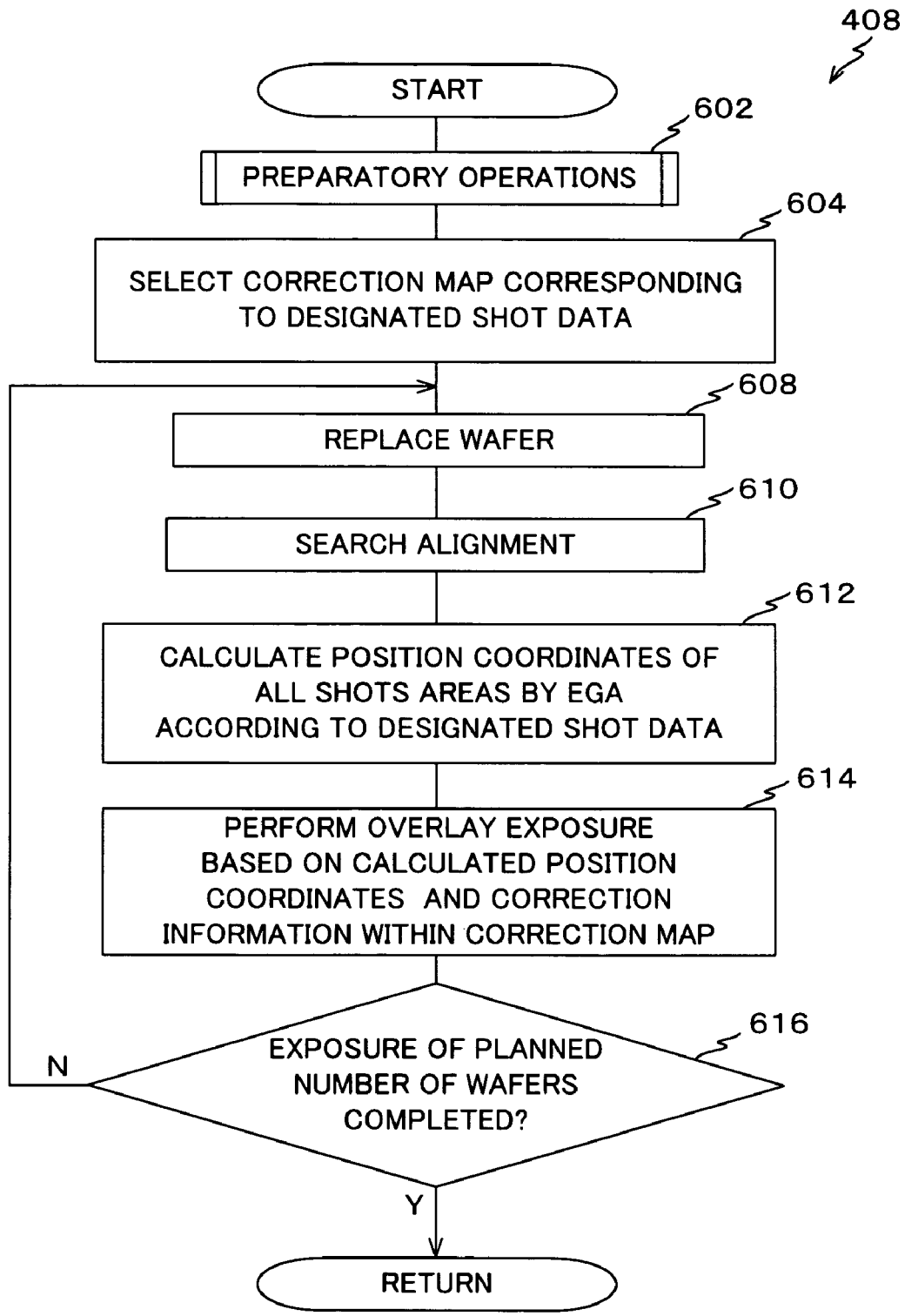
FIG. 13 is a flowchart showing a concrete processing algorithm of subroutine 408 in FIG. 6.

In subroutine 408, main control system 20 of exposure apparatus 100₁ performs a processing to wafer W subject to exposure according to a processing algorithm shown in the flowchart in FIG. 13.

In subroutine 408, first of all, predetermined preparatory operations are performed in subroutine 602, as in subroutine 432 described earlier. In other words, in subroutine 602, setting of exposure conditions, loading of reticle R, and reticle alignment and baseline measurement of alignment system AS are performed in the same manner as in steps 302, 304 and 306 in FIG. 5 described earlier.

In step 604, based on setting instruction information of exposure conditions that has been given along with the exposure instructions by host computer 150 in the above step 210 (refer to FIG. 4), the correction map, which corresponds to shot data such as shot map data and selection information of sample shot areas, included in the process program file that has been selected during the above predetermined preparatory operations is selectively read out from the database within the storage unit and is temporarily stored in the internal memory.

In step 608, the wafer (refer to as 'W'' for the sake of convenience) after the exposure processing on wafer holder 25 in FIG. 2 is replaced with wafer W before exposure, using a wafer loader (not shown). However, when wafer W' does not exist on wafer holder 25, wafer W before exposure is simply loaded on wafer holder 25.

In step 610, search alignment is performed to wafer W loaded on wafer holder 25, in the same manner as is described earlier.

In step 612, according to the shot data such as the shot map data and the selection information of sample shot areas, wafer alignment by the EGA method is performed likewise as described earlier, and position coordinates of all shot areas on ware W are calculated and stored in a predetermined region of the internal memory.

In step 614, based on the arrangement coordinates of all shot areas stored in a predetermined region within the internal memory described earlier, and the correction value (the correction information) of a non-linear component of positional deviation amount with respect to each shot area in the correction map temporarily stored within the internal memory, an overlay correction position in which a positional deviation amount (a linear component and a non-linear component) of each shot area is calculated. Also, based on data of the overlay correction position and the baseline amount measured in advance, the exposure operation by the step-and-scan method is performed by repeating an operation for sequentially moving wafer stage WST (wafer W) to a scanning starting position (an acceleration starting position) to expose each shot area on wafer W and an operation for transferring a reticle pattern onto the wafer while synchronously moving reticle stage RST and wafer stage WST in a scanning direction. With this operation, the exposure processing to wafer W at the head of a lot (the first wafer in the lot) is completed.

In step 616, the judgment is made of whether or not exposure to the planned number (e.g. twenty-five) of wafers is completed. When the judgment is negative, the procedure returns to step 608, and afterward, the above processing and judgment are repeatedly performed.

In this manner, when exposure to the planned number of wafers W is completed, the affirmative judgment is made in step 616, and the processing of subroutine 408 in FIG. 13 ends. Then, the procedure returns to step 410 of the main routine in FIG. 6, and after host computer 150 is notified via LAN160 and terminal server 140 that exposure is completed, a series of processing is completed.

As is obvious from the description so far, in exposure apparatus 100₁, a detection system is composed of alignment system AS, wafer laser interferometer system 18 that measures a position of wafer stage WST, main control system 20 that calculates a position coordinate on a stage coordinate system of an alignment mark arranged in each shot area on the wafer based on the measurement results of alignment system AS and the measurement value of wafer laser interferometer system 18 at the time of the measurement of alignment system AS. The detection system detects an actual measurement value of positional information of a divided area of any shot area on the wafer held on wafer stage WST.

Main control system 20 (more concretely, CPU) and a software program realize a computation unit, a judgment unit, an updating unit, a control unit, a determining unit and a calculating unit. In other words, by the processing of step 488 performed by main control system 20, the computation unit is realized that calculates estimate values of positional information used to align each shot area on the wafer with a predetermined point by a statistical computation, using the actual measurement values of positional information of a plurality of sample shot areas on the wafer that have been detected by the detection system. In addition, by the processing of steps 496 and 498 performed by main control system 20, the judgment unit is realized that with respect to a plurality of measurement shot areas including at least a sample shot area among a plurality of shot areas on the wafer, calculates an variation amount of a non-linear component of positional deviation amount from an individual fiducial position (a position in design) of each measurement shot area respectively, at predetermined intervals (e.g., once in (K−1) lots (K is an integer equal to or greater than two)) based on the actual measurement value of positional information of each measurement shot area detected by the detection system and the estimate values of positional information calculated by the computation unit, and judges the necessity of update of correction information used to correct a non-linear component of positional deviation amount from an individual fiducial position (a position in design) of each of a plurality of shot areas on the wafer, based on magnitude of the calculated variation amount of a non-linear component of positional deviation amount of each measurement shot area.

In addition, by the processing of steps 500, 502 and 504 performed by main control system 20, the updating unit is realized that performs a processing of updating the correction information when the judgment unit judges that update is necessary. Out of these steps, by the processing in step 500 in particular, the determining unit is realized that determines at least a part of remaining shot areas excluding the measurement shot areas among a plurality of shot areas on the wafer, as new measurement shot areas. By the processing in steps 502 and 504, the calculating unit is realized that calculates the non-linear component of positional deviation amount of each of a plurality of shot areas on the wafer, based on the actual measurement values of positional information of all measurement shot areas including the actual measurement values of positional information of the new measurement shot areas that have been detected by the detection system. In addition, by the processing in steps 490 to 500 performed by main control system 20, the evaluation unit is realized that evaluates a non-linear component of positional deviation amount from an individual fiducial position of each measurement shot area with respect to a plurality of measurement shot areas including at least a sample shot area among a plurality of shot areas on the wafer, at predetermined intervals (e.g. once in (K−1) lots (K is an integer equal to or greater than two)), based on the actual measurement value of position information of each shot area detected by the detection system and the estimate values of positional information calculated by the computation unit, and determines at least one of the number of new measurement shot areas to be added and an arrangement thereof and whether the correction map should be updated or not, based on the evaluation results.

Further, by the processing in step 506 performed by main control system 20, the control unit is realized that controls a position of wafer W via wafer stage WST based on the estimate value of positional information of each shot area and the latest correction information, when exposing each shot area.

However, as a matter of course, the exposure apparatus of the present invention is not limited to this. In other words, the above embodiment is a mere example, and at least a part of composing sections that are realized by the processing by main control system 20 (to be more precise, CPU) according to the software program may be constituted by a hardware.

As have been described above, with lithography system 110 according to the embodiment, host computer 150 instructs exposure to exposure apparatus 100$_1$ designating exposure conditions, in the case when an error between shots includes many non-linear components and it is judged that the correction of overlay error is difficult only with wafer alignment by the EGA method (steps 204, 206 and 210 in FIG. 4).

And, when main control system 20 of exposure apparatus 100$_1$ judges that the overlay error between lots is large, the processing of subroutine 406 in FIG. 6 is executed.

Subroutine 406 is executed to wafers of each lot every time when host computer 150 instructs exposure designating exposure conditions to exposure apparatus 100$_1$ and main control system 20 of exposure apparatus 100$_1$ judges that the overlay error between lots is large.

In subroutine 406, as shown in the flowchart of FIG. 7, regarding the processing of the same process name (process name A in the above description), the processing of subroutine 418 is executed to wafers in the first lot, and the processing of subroutine 422 is continuously executed the (K−2) number of times to wafers in the second to K$^{th}$ lots. Then, the processing of subroutine 424 is executed. Also to wafers in the succeeding lots, after the processing of subroutine 422 is continuously executed the (K−2) number of times, the processing of subroutine 424 is executed. In this case, K is an integer equal to or greater than two, and when K equals two (K=2), the processing of subroutine 424 is executed to each lot of the second and succeeding lots.

In the processing of subroutine 418, by introduction of the evaluation function as is described earlier, a non-linear distortion of wafer W can be evaluated based on concrete ground without relying on empirical rule. Based on the evaluation results, the correction map made up of the correction value of a non-linear component of positional deviation amount (arrangement deviation) of each shot area on wafer W can be made. And, based on the correction value within the correction map and the arrangement coordinates of shot areas obtained by the EGA, an overlay correction position in which the arrangement deviation (not only a liner component but also a non-linear component) of each shot area is corrected can be accurately obtained (steps 440 to 452 in FIG. 8). Therefore, by transferring a reticle pattern onto each shot area on wafer W while sequentially moving wafer W to a acceleration starting position (a scanning starting position) to expose each shot area on wafer W based on the overlay correction position of each shot area, the reticle pattern can be overlaid with very high precision on each shot area on wafer W.

In subroutine 418, when exposing the g$^{th}$ (the second) and succeeding wafer W in the lot, main control system 20 of exposure apparatus 100$_1$ corrects a linear component of the arrangement deviation of shot areas on the wafer based on the measurement results by the normal eight-point EGA, and also uses the correction map at the time (the correction map updated prior to exposure of a wafer at the head of the lot, or the correction map made or updated before the time) as it is with regard to the non-linear component of arrangement deviation of shot areas (steps 450 and 452 in FIG. 8).

This is because it is considered that the arrangement deviation (the positional deviation) of shot areas hardly changes with respect to wafers within the same lot, and even if the correction map at the time is used, overlay precision on exposure is hardly lowered while throughput is improved.

In subroutine 424, as shown in FIG. 12, while main control system 20 of exposure apparatus 100$_1$ sequentially sets a position of wafer stage WST, position coordinates (actual measurement values of position information) of a plurality of sample shot areas on wafer W held on wafer stage WST are detected using aliment system AS and wafer laser interferometer system 18 (step 487). In addition, main control system 20 calculates position coordinates (estimate values of positional information) used to align each shot area on wafer W with a predetermined point (e.g. a projection center of a reticle pattern), by the EGA computation using the detected position coordinates of sample shot areas (step 488).

With respect to a plurality of measurement shot areas on wafer W, main control system 20 calculates a positional deviation amount of each measurement shot area, its non-linear component and a variation amount of the non-linear component respectively, once in (K−1) lots, based on the measured actual measurement value of positional information of each measurement shot area and the calculated estimate value of positional information (step 496). Then, main control system 20 judges the necessity of update of the correction map (the correction information) used to correct the non-linear component of positional deviation amount of each of a plurality of shot areas on wafer W, based on magnitude of the calculated non-linear component (or its variation amount) of positional deviation amount of each measurement shot area (step 498).

That is, main control system (the judgment unit) judges the necessity of update of the correction map, by checking once in (K−1) lots the non-linear component (or, its variation amount) of positional deviation amount obtained based on the actual measurement values of positional information of shot areas (measurement shot areas) which are a part of a plurality of shot areas on wafer W, and the estimate values of positional information of measurement shot areas calculated from all of or a part of the actual measurement values. Therefore, it becomes possible to reduce the number of shot areas subject to positional information measurement and the measurement time without fail, compared with the conventional art in which the actual measurement values of positional information of all shot areas on the wafer are obtained at least once in a lot and correction values of positional deviation amount of a plurality of shot areas are calculated using the actual measurement values, in order to update the correction values of positional deviation amount of a plurality of shot areas.

In addition, when it is judged that update is necessary, main control system 20 (the updating unit) performs a processing to update the correction information. That is, when main control system 20 judges that it is necessary to update the correction map as a result of the above check, the correction information is updated (steps 500 to 506).

In addition, with respect to a plurality of measurement shot areas on wafer W, main control system 20 (the evaluation unit) evaluates once in (K−1) lots a non-linear component of positional deviation amount of each measurement shot area based on the detected actual measurement value of positional information of each measurement shot area and the calculated estimate value of positional information, and determines the number and the arrangement of new measurement shot areas to be added based on the evaluation results (step 500). In other words, when the number of measurements shot areas is not sufficient, measurement shot areas are added based on the evaluation results of the non-linear component of positional deviation amount of each measure shot area, and therefore, it is possible to set a part of a plurality shot areas on the wafer (it is enough to include a plurality of sample shot areas) as initial measurement shot areas. Thus, also in this regard, it becomes possible to decrease the number of shot areas subject to positional information measurement and the measurement time without fail, comparing with the above-described conventional art.

In addition, the main control system (the evaluation unit) can determine the arrangement of measurement shot areas efficiently in accordance with the evaluation results, such as arranging many of new measurement shot areas in the periphery of a measurement shot area where the non-linear component of positional deviation amount is large, and not arranging the new measurement shot areas in the periphery of a measurement shot area where the non-linear component of positional deviation amount is small.

And, using a non-linear component of positional deviation amount from an individual fiducial position of each of a plurality of shot areas on wafer W that is obtained by interpolation computation based on the actual measurement values of positional information of all measurement shot areas including the actual measurement values of positional information of the new measurement shot areas that are detected, main control system 20 (the updating unit) updates the correction map related to the non-linear component of positional deviation amount of each of a plurality of shot areas (step 504).

In addition, when exposing each shot area on wafer W, main control system 20 (the control unit) calculates an overlay correction position in which a positional deviation amount (a linear component and a non-linear component) of each shot area on wafer W based on the estimate value of position information of each shot area and the latest correction map, and controls a position of wafer W via wafer stage WST based on the calculation results. As a consequence, position control of wafer stage WST is performed with good precision when exposure is performed.

Accordingly, when continuously or intermittently exposing each of wafers in a plurality of lots (e.g. twenty-five wafers in a lot), exposure with high throughput and good overlay precision can be performed.

In subroutine 424, when exposing the $u^{th}$ (the second) and succeeding wafer W in the lot, main control system 20 corrects a linear component of arrangement deviation of shot areas on the wafer based on the measurement results by the normal eight-point EGA without updating the correction map and judging whether the update is necessary or not. Also, main control system 20 uses the correction map at the time (the correction map updated prior to exposure of a wafer at the head of the lot, or the correction map made or updated before the time) as it is, for the non-linear component of arrangement deviation of shot areas (step 506).

Likewise as is described above, this is because it is considered that the arrangement deviation (the positional deviation) of shot areas hardly changes with respect to wafers within the same lot, and even if the correction map at the time is used, overlay precision on exposure is hardly lowered while throughput is improved.

In subroutine 422, when exposing all wafers W in the lot, main control system 20 corrects a linear-component of the arrangement deviation of shot areas on the wafer based on the measurement results by the normal eight-point EGA, and also uses the correction map at the time (made or updated before the time) as it is with respect to the non-linear component of arrangement deviation of shot areas (step 476).

Meanwhile, main control system 20 of exposure apparatus $100_1$ judges that the overlay error between lots is small, a processing of subroutine 408 in FIG. 6 is executed. In subroutine 408, main control system 20 selects a correction map corresponding to shot map data and sample shot areas that are designated as one of exposure conditions (step 604 in FIG. 13). In addition, based on the actually measured positional information of each sample shot area obtained by detecting a plurality of wafer marks that are arranged so as to correspond to each of a plurality of sample shot areas (at least three specific shot areas designated as one of exposure conditions) on the wafer, main control system 20 obtains positional information to be used to align each shot area with a projection position of a reticle pattern, by statistical computation (the EGA computation). Based on the positional information and the selected correction map, main control system 20 moves each shot area on the wafer to an accelerating starting position for exposure (an exposure fiducial position) and then performs scanning exposure to each shot area (Steps 612 and 614).

In other words, in subroutine 408, positional information to be used to align each shot area, in which a liner component of positional deviation amount from an individual fiducial position (a design value) of each shot area obtained by the above statistical computation has been corrected, with a projection position of a reticle pattern is corrected using the corresponding correction information included in the selected correction map. And, based on the corrected positional information (i.e. positional information in which both a linear component and a non-linear component of positional deviation amount from the individual fiducial position (the designed value) of each shot area are corrected), each shot area on the wafer is moved to an accelerating starting position for exposure, and then exposure to each shot area is performed. Therefore, exposure with high precision and almost without overlay error becomes possible.

In this manner, with exposure apparatus $100_1$ and exposure method thereof, when continuously or intermittently exposing each of wafers in a plurality of lots, it becomes possible to perform exposure maintaining high throughput and good overlay precision.

As is obvious from the description so far, lithography system 110 of the embodiment makes it possible to reduce overlay error caused by a grid error of a stage between exposure apparatuses to remarkably small. In particular, in the case of a processing of subroutine 406, an error between shots that varies with respect to each lot can be corrected with good precision, and in the case of a processing of subroutine 408, an error between shots that varies with each change in the shot map and the sample shot area can be corrected with good precision.

In the above embodiment, the case has been described where main control system 20 of exposure apparatus $100_1$ judges the necessity of update of the correction map for every (K−1)=3 lots, that is, for every seventy-five (3×25=75) wafers and the correction map is updated when it is judged that update is necessary, when continuously or intermittently exposing each of wafers in a plurality of lots. However, the present invention is not limited to this, and the judgment of whether the update of the correction map is necessary or not may be made for every predetermined period of time (predetermined days).

In addition, in the above embodiment, exposure apparatus $100_1$ is constituted so that the first mode in which only a plurality of sample shot areas are designated as a plurality of measurement shot areas on wafer W, and the second mode in which a plurality of sample shot areas and at least a part of remaining shot areas are designated as a plurality of measurement shot areas on wafer W can be set. However, the exposure apparatus of the present invention is limited to this, and a mode cannot be selected and only one of the first mode and the second mode of the embodiment may substantially be set. In other wards, only a flow of the processing in steps 490→494→496 or steps 490→496 may be set.

Alternatively, when the judgment is negative in the above step 492, in prior to the processing of the above step 496, instead of the processing of step 494, new measurement shot areas may be determined in the same manner as in step 500 of the embodiment based on a positional deviation amount of each sample shot area or magnitude of its non-linear component, and positional information of the new measurement shot area may be measured.

In the embodiment, main control system 20 evaluates a non-linear component (or its variation amount) of positional deviation amount of each measurement shot area, and new measurement shot area (to be added) is determined based on the evaluation results in step 500 of subroutine 424 However, the present invention is not limited to this, and new measurement shot areas may be determined based on the evaluation results of the non-linear component of positional deviation amount of each divided area included in the correction map before update.

In addition, in the embodiment, the correction information is stored in the data table in a form of correction map within the memory such as RAM. However, the present invention is not limited to this, and the correction information may be stored in the memory in a form of correction function.

In the above embodiment, for example in subroutine 418, the eight-point EGA is performed to the second and succeeding wafers in the lot. However, it is a matter of course that the number of measurement points (the number of alignment marks (normally corresponding to the number of sample shot areas)) of the EGA may be any number only if the number of measurement points are greater than the number of unknown parameters (six in the embodiment) obtained by a statistical computation.

In subroutine 418 of the embodiment, when exposing a wafer at the head of the lot, each shot area is positioned with a scanning starting potion based on a shot arrangement coordinate calculated by the EGA computation using the measurement results of wafer marks of all shot areas and a non-linear component of an arrangement coordinate calculated based on the interpolation function. However, the present invention is not limited to this, and each shot area is positioned to a scanning starting position based on the actual measurement value of positional deviation amount of each shot area measured in step 440 without performing the EGA computation.

In addition, in the embodiment, when g is set to an integer equal to or greater than three, the processing of steps 440 to 448 is repeatedly performed to the first (g−1) wafers (a plurality of wafers) within the lot. When performing the processing, in step 448, with respect to the second to $(g-1)^{th}$ wafers, a non-linear component of arrangement deviation of all shot areas (a correction value) may be obtained based on, for example, the mean value of the computation results obtained so far. As a matter of course, with respect to the $g^{th}$ ($g \geq 3$) and succeeding wafers, the mean value of a non-linear component (a correction value) calculated each for at least two wafers up to the $(g-1)^{th}$ wafer may be used.

Further, in step 444 of FIG. 8. a linear component and a non-linear component of positional deviation amount of each shot area are separated using the position coordinate measured in step 440, the position coordinate in design and the position coordinate (the estimate value) calculated in step 442. However, only a non-linear component may be obtained without separating a linear component and a non-linear component. In this case, a difference between the position coordinate measured in step 440 and the position coordinate calculated in step 442 may be made a non-linear component. In addition, search alignment in step 312 of FIG. 5, step 436 of FIG. 8, step 472 of FIG. 11, step 486 of FIG. 12 and step 610 of FIG. 13 needs not to be performed in the case such as when a rotational error of wafer W is within the permissible range.

In addition, in the embodiment, the case has been described where exposure apparatus $100_1$ having a grid correction function has both the first grid correction function and the second grid correction function. However, the present invention is not limited to this, and the exposure apparatus may have only the first gird correction function.

In the embodiment, the correction data of a linear component of positional deviation amount of a wafer at the head of the lot in subroutine 418 is obtained by the EGA computation using all shot areas as sample shot areas. However, the present invention it not limited to this, and the correction data may be obtained by the EGA computation using the detection results of marks on designated sample shot areas, in the same manner as for the second and succeeding wafers in the lot.

In the embodiment, when performing wafer alignment by the EGA method, coordinate values of alignment marks of the sample shot areas (when all shot areas or a plurality of specific shot areas among all shot areas are selected as sample shot areas, the selected specific shot areas) are used. However, for example, with respect to each sample shot area, a positional deviation amount from a mark on reticle R or an index mark of alignment system AS may be detected by moving wafer W according to a coordinate value in design of each sample shot area, and using the positional deviation, a positional deviation amount from the coordinate value in design may be calculated with respect to each shot area by a statistical computation, or a correction amount of a step pitch between shot areas may be calculated.

Further, in the embodiment, the description has been made premising the EGA method, however, the weighted EGA method may be used instead of the EGA method, or the multiple point within shot EGA method and the like may be used. Wafer alignment by the weighted EGA method is disclosed in detail in, for example, Kokai (Japanese Unexamined Patent Application Publication) No. 05-304007, and the corresponding U.S. Pat. No. 5,525,808, and the like.

In other words, in the weighted EGA method, position coordinates on a stationary coordinate system of at least three sample shot areas selected in advance out of a plurality of shot areas (divided areas) on a wafer are measured. Next, with respect to each shot area on the wafer, in accordance with a distance between the shot area (its center point) and each of sample shot areas (its center point), or in accordance with a distance between the shot area and a predetermined point being focused defined in advance on the wafer (a first information) and a distance between the point being focused and each of sample shot areas (a second information), each of the position coordinates on the stationary coordinate system of samples shot areas is weighted, and by performing a statistical computation (the least-squares method, a simple averaging processing or the like) using a plurality of the weighted position coordinates, a position coordinate on the stationary coordinate system of each of a plurality of shot areas on the wafer is determined. Then, based on the determined position coordinate, each of a plurality of shot areas arranged on the wafer is positioned with a predetermined fiducial position (e.g. a transfer position of a reticle pattern) within the stationary coordinate system.

According to such weighted EGA method, even with the wafer where local arrangement error (a non-linear distortion) exists, the number of sample shots is relatively small and all shot areas can be aligned with a predetermined fiducial position with high precision and high speed while suppressing calculation amount.

In addition, the multiple point within shot EGA method is disclosed in, for example, Kokai (Japanese Unexamined Patent Application Publication) No. 06-349705, and the corresponding U.S. Pat. No. 6,278,957, and the like. In the multiple point within shot EGA, a plurality of alignment marks are detected to obtain a plurality of X coordinates and Y-coordinates respectively with respect to each sample shot, and positional information of each shot area, for example, a coordinate value is calculated using a model function that includes at least one of a rotational error of a shot area, an orthogonal degree, and a shot parameter corresponding to scaling (a chip parameter), besides a wafer parameter corresponding to a expansion/contraction and rotation of a wafer and the like used in the EGA method.

To describe more specifically, in the multiple-point within shot EGA method, a plurality of alignment marks (either of one-dimensional marks or tow-dimensional marks may be used), which are arranged in a constant relative positional relation in design with respect to a fiducial position within each shot area arranged on a substrate, are respectively formed, and positional information of a predetermined number of alignment marks out of these alignment marks existing on the substrate are measured. The predetermined number of alignment marks are the alignment marks in which the sum of the number of X positional information and the number of Y positional information is greater than the total number of wafer parameters and shot parameters included in the above model function, and a plurality of positional information in the same direction are obtained regarding the same sample shot. BY assigning the positional information to the above model function and performing a statistical processing using the least-squares method, a parameter included in the model function is calculated, and from this parameter, positional information in design of the fiducial position within each shot area, and relative positional information in design of the alignment marks with respect to the fiducial position, positional information of each shot area is calculated.

In these cases, as positional information, a coordinate values of alignment marks may be used, and a statistical computation may be performed using any information if the information is positional information related to alignment marks and is appropriate information for a statistical processing. As long as the national laws in designated states (or elected states), to which this international application is applied, permit, the disclosures of the above U.S. Pat. No. 5,525,808 and U.S. Pat. No. 6,278,957 are incorporated herein by reference.

Besides, the number of EGA measurement points in the EGA method, the weighted EGA method, or the multiple-point within shot EGA may be appropriately determined, based on radius s obtained by the evaluation results using the above evaluation function.

In the embodiment, the case has been described where an FIA system by an off-axis method (an alignment sensor by an image-forming method) is used as a mark detection system. However, the present invention is not limited to this, a mark detection system of any method may be used. That is, a TTR (Through the Reticle) method, a TTL (Through the Lens) method, or any method of an off-axis method, and further other detection methods than an image-forming method (an image processing method) employed in the FIA system such as a method to detect a diffracted beam and a scattered beam may be used. For example, alignment system may be used that detects a diffracted beam by irradiating a coherent beam almost perpendicularly to an alignment mark on a wafer, and making diffracted beams of the same order ($\pm$first-order, $\pm$second-order, ..., $\pm n^{th}$-order diffracted beam) that are generated from the mark interfere. In this case, the diffracted beam may be independently detected with respect to each order and the detection results of at least one order may be used, or a plurality of coherent beams having different wavelengths may be irradiated to an alignment mark and a diffracted beam may be detected by making the diffracted beam of each order interfere with respect to each wavelength.

In addition, the present invention is not limited to an exposure apparatus by the step-and-scan method as in the embodiment, and can be applied exactly likewise to exposure apparatuses of various methods such as an exposure apparatus by the step-and-repeat method and an exposure apparatus by the proximity method (an X-ray exposure apparatus and the like).

In the embodiment, as a light source, a far ultraviolet light source such as a KrF excimer laser and an ArF excimer laser, a vacuum ultraviolet light source such as an $F_2$ laser, an extra-high pressure mercury lamp that emits an emission line (a g-line, an i-line or the like) in the ultraviolet region or the like may be used. Besides, when a light of a vacuum ultraviolet region is used as an illumination light for exposure, a light source is not limited to a laser light emitted from each of the above light sources, a harmonic wave may be used that is obtained by amplifying a single-wavelength laser beam in the infrared or visible range oscillated by a DFB semiconductor laser or fiber laser, with a fiber amplifier doped with, for example, erbium (Er) (or both erbium and ytteribium (Yb)), and by converting the wavelength into ultraviolet light using a nonlinear optical crystal.

Furthermore, the present invention may be applied to an exposure apparatus that uses an EUV beam, an X-ray or charged particle beams such as an electron beam or an ion beam, as an illumination light for exposure. Besides, for example, an immersion exposure apparatus that has liquid filled in between projection optical system PL and the wafer whose details are disclosed in, for example, the International Publication WO99/49504, may be used.

The present invention is not limited to the exposure apparatus for manufacturing semiconductors, and the present invention can be applied to, for example, an exposure apparatus used for manufacturing displays including liquid crystal devices that transfers a device pattern onto a glass plate, an exposure apparatus used for manufacturing thin-film magnetic heads that transfers a device pattern on a ceramic wafer, an exposure apparatus used for manufacturing imaging devices (such as CCD), micromachines, organic EL, DNA chips or the like. In addition, the present invention can be applied to an exposure apparatus that transfers a circuit pattern onto a glass substrate or a silicon wafer, not only when producing microdevices such as semiconductor devices, but also when producing a reticle or a mask used in an optical exposure apparatus, an EUV exposure apparatus, an X-ray exposure apparatus, an electron beam exposure apparatus, or the like. In an exposure apparatus using a DUV (far-ultraviolet) light and a VUV (vacuum ultraviolet) light, a transmissive reticle is used in general, and as a reticle substrate, silica glass, fluorine-doped silica glass, fluorite, magnesium fluoride, crystal or the like is used. In an X-ray exposure apparatus by the proximity method, an electron beam exposure apparatus or the like, a transmissive mask (a stencil mask, a membrane mask) is used, and as a mask substrate a silicon wafer is used.

[Device Manufacturing Method]

Next, an embodiment will be described of a device manufacturing method that uses the lithography system and the exposure method thereof according to the above embodiment in the lithography step.

Figure 14:
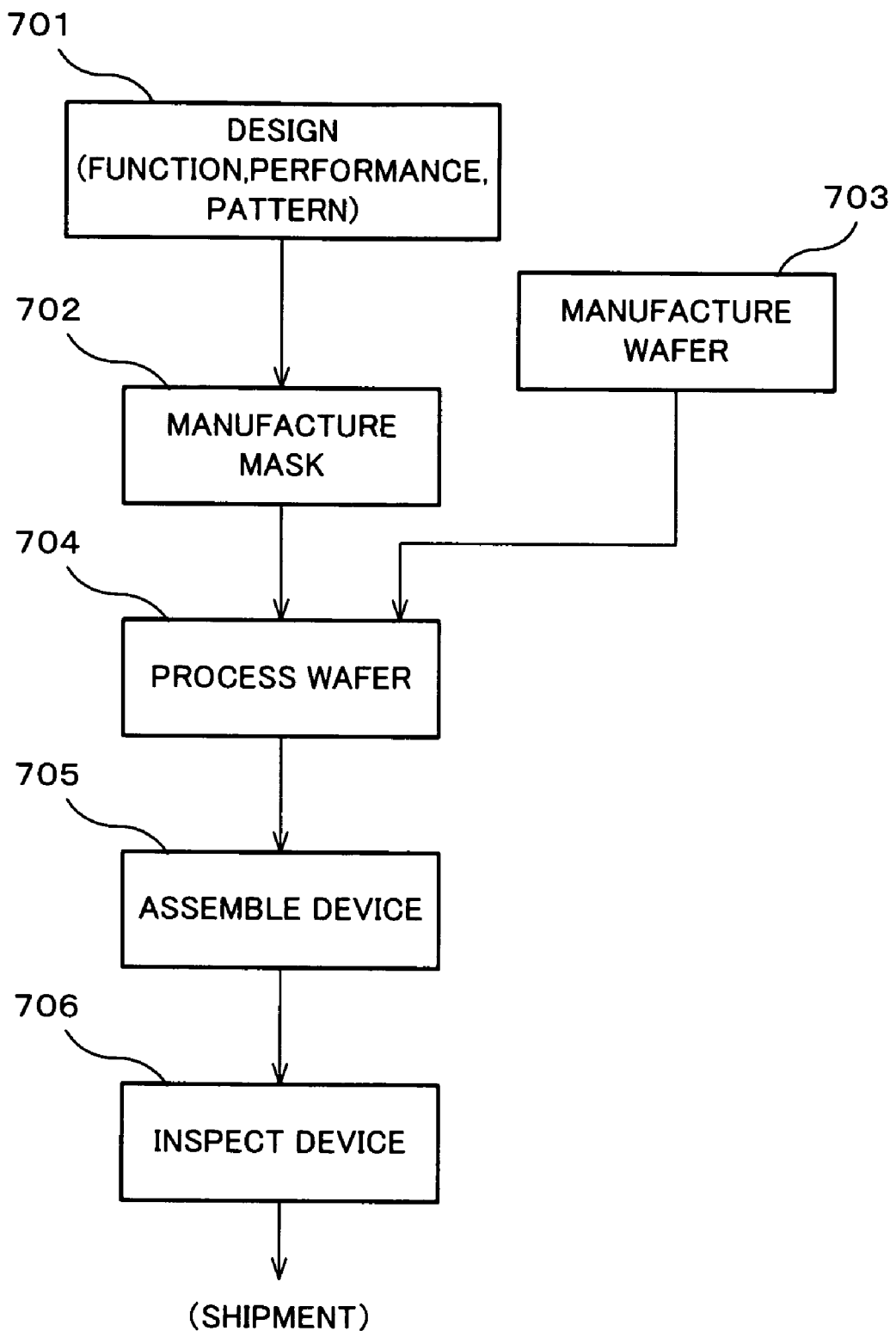
FIG. 14 is a flowchart used to explain an embodiment of a device manufacturing method of the present invention.

FIG. 14 shows the flowchart of an example when manufacturing a device (a semiconductor chip such as an IC or an LSI, a liquid crystal panel, a CCD, a thin-film magnetic head, a micromachine, and the like). As shown in FIG. 14, in step 701 (design step), function and performance design of device (circuit design of semiconductor device, for example) is performed first, and pattern design to realize the function is performed. Then, in step 702 (mask manufacturing step), a mask on which the designed circuit pattern is formed is manufactured. Meanwhile, in step 703 (wafer manufacturing step), a wafer is manufactured using materials such as silicon.

Next, in step 704 (wafer processing step), the actual circuit and the like are formed on the wafer by lithography or the like in a manner that will be described later, using the mask and the wafer prepared in steps 701 to 703. Then, in step 705 (device assembly step), device assembly is performed using the wafer processed in step 704. Step 705 includes processes such as the dicing process, the bonding process, and the packaging process (chip encapsulation), and the like when necessary.

Finally, in step 706 (inspection step), tests on operation, durability, and the like are performed on the devices made in step 705. After these steps, the devices are completed and shipped out.

Figure 15:
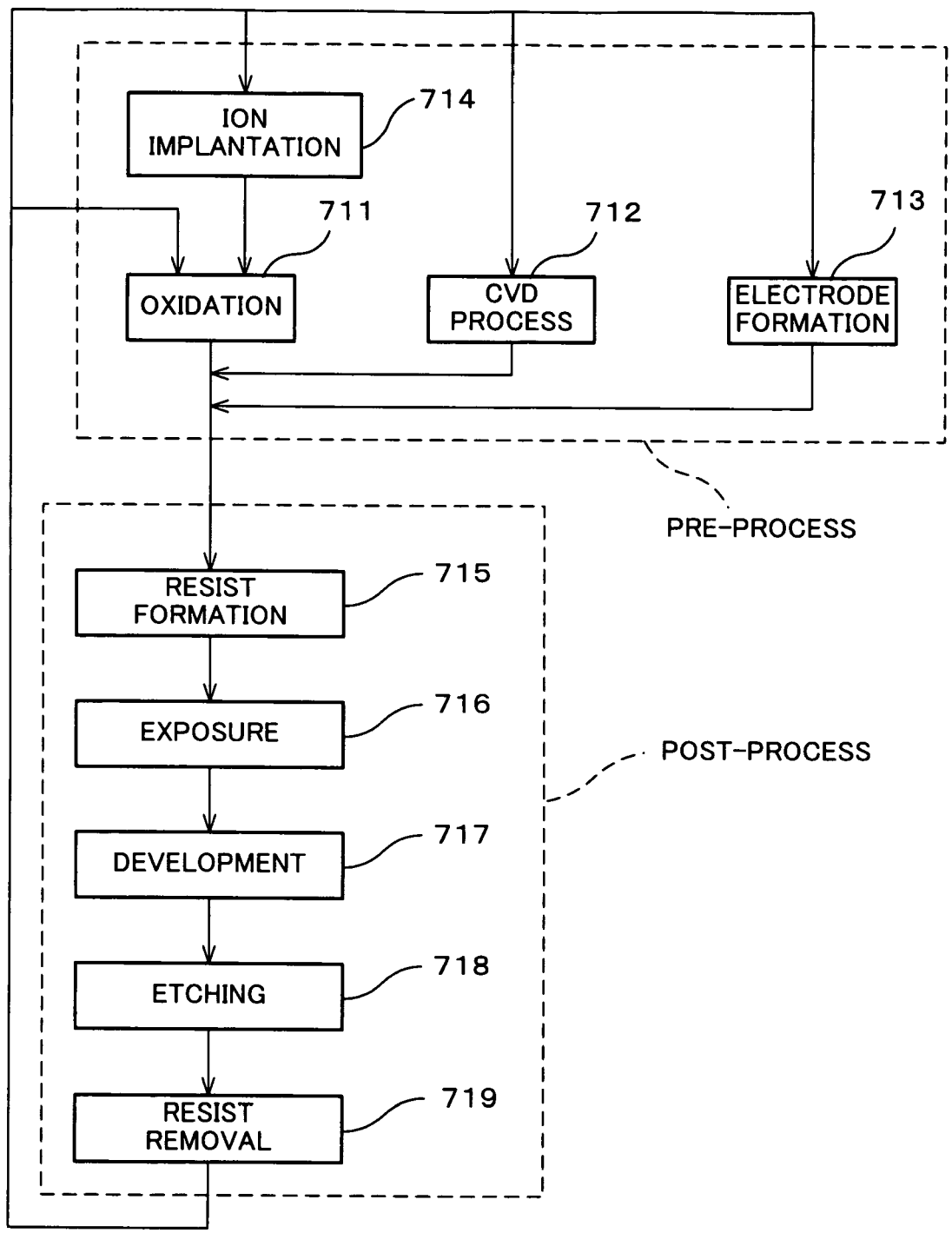
FIG. 15 is a flowchart showing an example of a processing in detail in step 704 in FIG. 14.

FIG. 15 is the flowchart showing a detailed flow example of the above step 704 in the case of semiconductor devices. Referring to FIG. 15, in step 711 (oxidation step), the surface of wafer is oxidized. In step 712 (CDV step), an insulating film is formed on the wafer surface. In step 713 (electrode formation step), an electrode is formed on the wafer by deposition. In step 714 (ion implantation step), ions are implanted into the wafer. Each of the above steps 711 to 714 constitutes the pre-process in each stage of wafer processing, and the necessary processing is chosen and is executed at each stage.

When the above-described pre-process ends in each stage of wafer processing, post-process is executed as follows. In the post-process, first in step 715 (resist formation step), a photosensitive agent is coated on the wafer. Then, in step 716 (exposure step), the circuit pattern of the mask is transferred onto the wafer by the exposure apparatus and the exposure method described above. Next, in step 717 (development step), the exposed wafer is developed, and in step 718 (etching step), an exposed member of an area other than the area where resist remains is removed by etching. Then, in step 719 (resist removing step), when etching is completed, the resist that is no longer necessary is removed.

By repeatedly performing the pre-process and the post-process, multiple circuit patterns are formed on the wafer.

When the above device manufacturing method of the embodiment described above is used, because the lithography system and the exposure method thereof according to the embodiment above is used in the exposure process (step 716) when performing an exposure processing of wafers of each lot, exposure with high precision becomes possible in which overlay precision between a reticle pattern and a shot area on a wafer is improved and throughput is decreased as little as possible. As a consequence, it becomes possible to transfer a finer circuit pattern on a wafer with good overlay precision without decreasing throughput, and the productivity (including the yield) of high integration microdevices can be improved. In particular, when a vacuum ultraviolet light source such as the F2 laser light source and the like is used as a light source, for example, even if the minimum line width is approximately 0.1 μm, the productivity can be improved in combination with improvement in a resolution of a projection optical system.

INDUSTRIAL APPLICABILITY

The exposure method and the exposure apparatus of the present invention are suitable for continuously or intermittently performing exposure to each of a plurality of photosensitive objects. Further, the device manufacturing method of the present invention is suitable for manufacturing microdevices. In addition, the program of the present invention is suitable for making a computer for control of an exposure apparatus perform exposure continuously or intermittently to each of a plurality of photosensitive objects.

What is claimed is:

1. An exposure method in which an exposure processing of a specific process is performed to each of photosensitive objects in a plurality of lots, the method comprising:

with respect to a first lot in the specific process, calculating an estimate value of positional information of each of a plurality of divided areas on the photosensitive object, which is used to align each of the plurality of divided areas with a predetermined point, by a statistical computation using actual measurement values of positional information of a plurality of specific divided areas selected from the plurality of divided areas on the photosensitive object, creating correction information used to correct a non-linear component of positional deviation amount of each of the plurality of divided areas from an individual fiducial position based on the actual measurement values of positional information of the plurality of specific divided areas and on the corresponding estimate value, and performing exposure while controlling a position of the photosensitive object based on the estimate value of the positional information of each of the plurality of divided areas and on the correction information; and with respect to every (K−1) lot of second and subsequent lots in the specific process, for a plurality of measurement divided areas on the photosensitive object that includes at least the plurality of specific divided areas, calculating a non-linear component of positional deviation amount of each of the measurement divided areas from the individual fiducial position based on an actual measurement value of positional information of each of the measurement divided areas and on the corresponding estimate value, updating the correction information as needed in accordance with a magnitude of one of the calculated non-linear component of positional deviation amount of each of the measurement divided areas and a variation amount of the non-linear component within a threshold, but not updating the correction information with respect to the remaining lots, and performing exposure while controlling the position of the photosensitive object based on the estimate value of positional information of each of the plurality of divided areas and on the correction information that is latest, wherein the K is an integer not less than 2.

2. The exposure method of claim 1, wherein
when updating the correction information,
among the plurality of divided areas, at least a part of remaining divided areas excluding the measurement divided areas are new measurement divided areas, and
the correction information is updated using a non-linear component of positional deviation amount of each of the plurality of divided areas from the individual fiducial position calculated based on actual measurement values of positional information of all measurement divided areas including the new measurement divided areas and on the corresponding estimate value.

3. The exposure method of claim 2, wherein
the new measurement divided areas are determined based on evaluation results of the non-linear component of positional deviation amount of each of the plurality of divided areas included in the correction information before update.

4. The exposure method of claim 2, wherein
the new measurement divided areas are determined based on evaluation results of one of the non-linear component of positional deviation amount of each of the measurement divided areas calculated with respect to the every (K−1) lot and the variation amount of the non-linear component.

5. The exposure method of claim 4, wherein
the evaluation of the non-linear component of positional deviation amount of each of the measurement divided areas is performed, taking into consideration at least one of magnitude and a dispersion degree of the non-linear component of positional deviation amount of each of the measurement divided areas in the correction information before update.

6. The exposure method of claim 4, wherein
the evaluation of the non-linear component of positional deviation amount of each of the measurement divided areas is performed using a predetermined evaluation function.

7. The exposure method of claim 4, wherein
the plurality of divided areas on the photosensitive object are grouped into a plurality of blocks in advance, and
the evaluation of the non-linear component of positional deviation amount of each of the measurement divided areas is performed with respect to each block.

8. The exposure method of claim 1, wherein
as the plurality of measurement divided areas on the photosensitive object, only the plurality of specific divided areas can be designated.

9. The exposure method of claim 1, wherein
as the plurality of measurement divided areas on the photosensitive object, at least a part of remaining divided areas can be designated in addition to the plurality of specific divided areas.

10. The exposure method of claim 1, wherein the correction information is one of a correction map and a correction function.

11. A device manufacturing method including a lithographic process wherein
in the lithographic process, an exposure processing of a specific process is continuously or intermittently performed to each of photosensitive objects in a plurality of lots by using the exposure method of claim 1.

12. An exposure apparatus that performs an exposure processing of a specific process to each of photosensitive objects in a plurality of lots, the apparatus comprising:
a moving body that holds a photosensitive object;
a detection system that detects actual measurement values of positional information of any divided areas among a plurality of divided areas on the photosensitive object held on the moving body;
a computation device that calculates an estimate value of positional information of each of the plurality of divided areas, which is used to align each of the plurality of divided areas with a predetermined point, by a statistical computation using actual measurement values of positional information of a plurality of specific divided areas among the plurality of divided areas on the photosensitive object detected by the detection system;
a creating device that, with respect to a first lot in the specific process, creates correction information used to correct a non-linear component of positional deviation amount of each of the plurality of divided areas from an individual fiducial position based on the actual measurement values of positional information of the plurality of specific divided areas among the plurality of divided areas on the photosensitive object detected by the detection system and on the corresponding estimate value of positional information calculated by the computation device;
an updating device that, with respect to every (K−1) lot of second and subsequent lots in the specific process, for a plurality of measurement divided areas on the photosensitive object that includes at least the plurality of specific divided areas,
calculates a non-linear component of positional deviation amount of each of the measurement divided areas from an individual fiducial position based on an actual measurement value of positional information of each of the measurement divided areas detected by the detection device and on the corresponding estimate value, and
updates the correction information as needed in accordance with a magnitude of one of the calculated non-linear component of positional deviation amount of each of the measurement divided areas and a variation amount of the non-linear component within a threshold, but does not update the correction information with respect to the remaining lots, wherein the K is an integer not less than 2; and
a control device that controls a position of the photosensitive object via the moving body based on the estimate value of positional information of each of the plurality of divided areas and on the correction information that is latest, when exposing each of the plurality of divided areas.

13. The exposure apparatus of claim 12, wherein the updating device comprises:
a determining device that determines at least a part of remaining divided areas excluding the measurement divided areas among the plurality of divided areas on the photosensitive object, as new measurement divided areas; and
a calculating device that calculates the non-linear component of positional deviation amount of each of the plurality of divided areas on the photosensitive object from the individual fiducial position, as new correction information, based on actual measurement values of positional information of all measurement divided areas including actual measurement values of positional information of the new measurement divided areas detected by the detection system and on the corresponding estimate value.

14. The exposure apparatus of claim 13, wherein the determining device determines the new measurement divided areas based on evaluation results of one of the non-linear component of positional deviation amount of each of the measurement divided areas calculated by the updating device and the variation amount of the non-linear component.

15. The exposure apparatus of claim 13, further comprising:
an evaluation device that, with respect to a plurality of measurement divided areas on the photosensitive object including at least the plurality of specific divided areas, evaluates a non-linear component of positional deviation amount of each of the measurement divided areas from an individual fiducial position based on the actual measurement value of positional information of each of the measurement divided areas detected by the detection system and on the estimate value of positional information calculated by the computation device, and determines at least one of the number of new measurement divided areas to be added and an arrangement thereof, based on the evaluation results.

16. The exposure apparatus of claim 15, wherein the plurality of divided areas on the photosensitive object are grouped into a plurality of blocks in advance, and the evaluation device performs the evaluation of the non-linear component of positional deviation amount of each of the measurement divided areas with respect to each block.

17. The exposure apparatus of claim 12, wherein
a first mode in which only the plurality of specific divided areas are designated as the plurality of measurement divided areas on the photosensitive object, and
a second mode in which the plurality of specific divided areas and at least a part of remaining divided areas are designated as the plurality of measurement divided areas on the photosensitive object are settable.

18. The exposure apparatus of claim 12, wherein the correction information is one of a correction map and a correction function.

19. A non-transitory computer readable medium that stores a program that makes a computer for control of an exposure apparatus that performs an exposure processing of a specific process to each of photosensitive objects in a plurality of lots execute a predetermined processing, the program making the computer execute:
a procedure of, with respect to a first lot in the specific process,
calculating an estimate value of positional information of each of a plurality of divided areas on a photosensitive object, which is used to align each of the plurality of divided areas with a predetermined point, by a statistical computation using actual measurement values of positional information of a plurality of specific divided areas selected from the plurality of divided areas on the photosensitive object,
creating correction information used to correct a non-linear component of positional deviation amount of each of the plurality of divided areas from an individual fiducial position based on the actual measurement values of positional information of the plurality of specific divided areas and on the estimate value, and
performing exposure while controlling a position of the photosensitive object based on the estimate value of positional information of each of the plurality of divided areas and on the correction information; and
a procedure of, with respect to every (K–I) lot of second and subsequent lots in the specific process, for a plurality of measurement divided areas on the photosensitive object that include at least the plurality of specific divided areas,
calculating a non-linear component of positional deviation amount of each of the measurement divided areas from an individual fiducial position based on an actual measurement value of positional information of each of the measurement divided areas and on the estimate value,
updating the correction information as needed in accordance with a magnitude of one of the calculated non-linear component of positional deviation amount of each of the measurement divided areas and a variation amount of the component within a threshold, but not updating the correction information with respect to the remaining lots, and
performing exposure while controlling the position of the photosensitive object based on the estimate value of positional information of each of the plurality of divided areas and on the correction information that is latest, wherein the K is an integer not less than 2.

* * * * *